US012813289B2

(12) United States Patent
Kobayashi et al.

(10) Patent No.: US 12,813,289 B2
(45) Date of Patent: Nov. 24, 2026

(54) LEAD FRAME AND SEMICONDUCTOR DEVICE

(71) Applicant: SHINKO ELECTRIC INDUSTRIES CO., LTD., Nagano (JP)

(72) Inventors: Konosuke Kobayashi, Nagano (JP); Kentaro Kaneko, Nagano (JP); Toru Maruyama, Nagano (JP); Kesayuki Sonehara, Nagano (JP); Masato Muramatsu, Nagano (JP); Takuya Miyazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 296 days.

(21) Appl. No.: 18/901,224

(22) Filed: Sep. 30, 2024

(65) Prior Publication Data

US 2025/0112131 A1 Apr. 3, 2025

(30) Foreign Application Priority Data

Oct. 3, 2023 (JP) ................................ 2023-171819

(51) Int. Cl.
*H10W 70/40* (2026.01)
*H10W 74/00* (2026.01)
*H10W 90/00* (2026.01)

(52) U.S. Cl.
CPC ....... *H10W 70/424* (2026.01); *H10W 70/417* (2026.01); *H10W 74/00* (2026.01); *H10W 90/756* (2026.01)

(58) Field of Classification Search
CPC ............. H10W 70/424; H10W 70/417; H10W 90/756
See application file for complete search history.

(56) References Cited

U.S. PATENT DOCUMENTS

| | | | | |
|---|---|---|---|---|
| 5,633,205 A * | 5/1997 | Tsuchiya | H10W 70/421 | 29/827 |
| 2009/0200649 A1* | 8/2009 | Tanaka | H10W 70/411 | 257/676 |
| 2011/0095406 A1* | 4/2011 | Mukaibara | H10W 44/20 | 174/250 |
| 2013/0316500 A1* | 11/2013 | Ota | H10W 42/121 | 438/118 |
| 2015/0206831 A1* | 7/2015 | Bai | H10W 70/048 | 257/667 |
| 2019/0287882 A1* | 9/2019 | Tsukagoshi | H10W 70/042 | |

FOREIGN PATENT DOCUMENTS

| | | |
|---|---|---|
| JP | H08-055948 | 2/1996 |
| JP | H10-056118 | 2/1998 |

* cited by examiner

*Primary Examiner* — Steven M Page
(74) *Attorney, Agent, or Firm* — IPUSA, PLLC

(57) ABSTRACT

A lead frame has inner leads arranged in a first direction, and each inner lead includes a first main surface parallel to the first direction, an end surface connecting to the first main surface, a first side surface connecting to the first main surface and to the end surface, and a second side surface connected to the first main surface and to the first side surface. In a plan view perpendicular to the first main surface, an angle between a first imaginary straight line including a first line of intersection between the first main surface and the end surface, and a second imaginary straight line including a second line of intersection between the first main surface and the second side surface, is less than 90 degrees on a side of each inner lead.

8 Claims, 21 Drawing Sheets

LEAD FRAME AND SEMICONDUCTOR DEVICE

CROSS-REFERENCE TO RELATED APPLICATIONS

This application is based upon and claims priority to Japanese Patent Application No. 2023-171819, filed on Oct. 3, 2023, the entire contents of which are incorporated herein by reference.

FIELD

Certain aspects of the embodiments discussed herein are related to lead frames, methods for manufacturing lead frames, and semiconductor devices.

BACKGROUND

Conventionally, when manufacturing a lead frame having inner leads, a plurality of inner leads are formed by wet etching of a metal plate, and ends of the inner leads are connected by a connecting part. Then, after a plating film or the like is formed, the connecting part is cut.

Examples of related art include Japanese Laid-Open Patent Publication No. H08-055948, and Japanese Laid-Open Patent Publication No. H10-056118, for example.

Due to high integration of a semiconductor element mounted on the lead frame, a density of high-density inner leads is increasing. For this reason, when cutting the connecting part, burrs may be generated to short-circuit adjacent inner leads. A yield of the lead frame deteriorates when such a short-circuit occurs.

SUMMARY

Accordingly, it is an object in one aspect of the present disclosure is to provide a lead frame, a method for manufacturing a lead frame, and a semiconductor device, which can prevent deterioration of the yield.

According to one aspect of the embodiments, a lead frame has a plurality of inner leads arranged in a first direction, wherein each inner lead of the plurality of inner leads includes a first main surface parallel to the first direction; an end surface connecting to the first main surface; a first side surface connecting to the first main surface and to the end surface; and a second side surface connected to the first main surface and to the first side surface, in a plan view perpendicular to the first main surface, an angle between a first imaginary straight line including a first line of intersection between the first main surface and the end surface, and a second imaginary straight line including a second line of intersection between the first main surface and the second side surface, is less than 90 degrees on a side of each inner lead, and a third line of intersection between the first main surface and the first side surface is located on the side of each inner lead than the first imaginary straight line and the second imaginary straight line.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
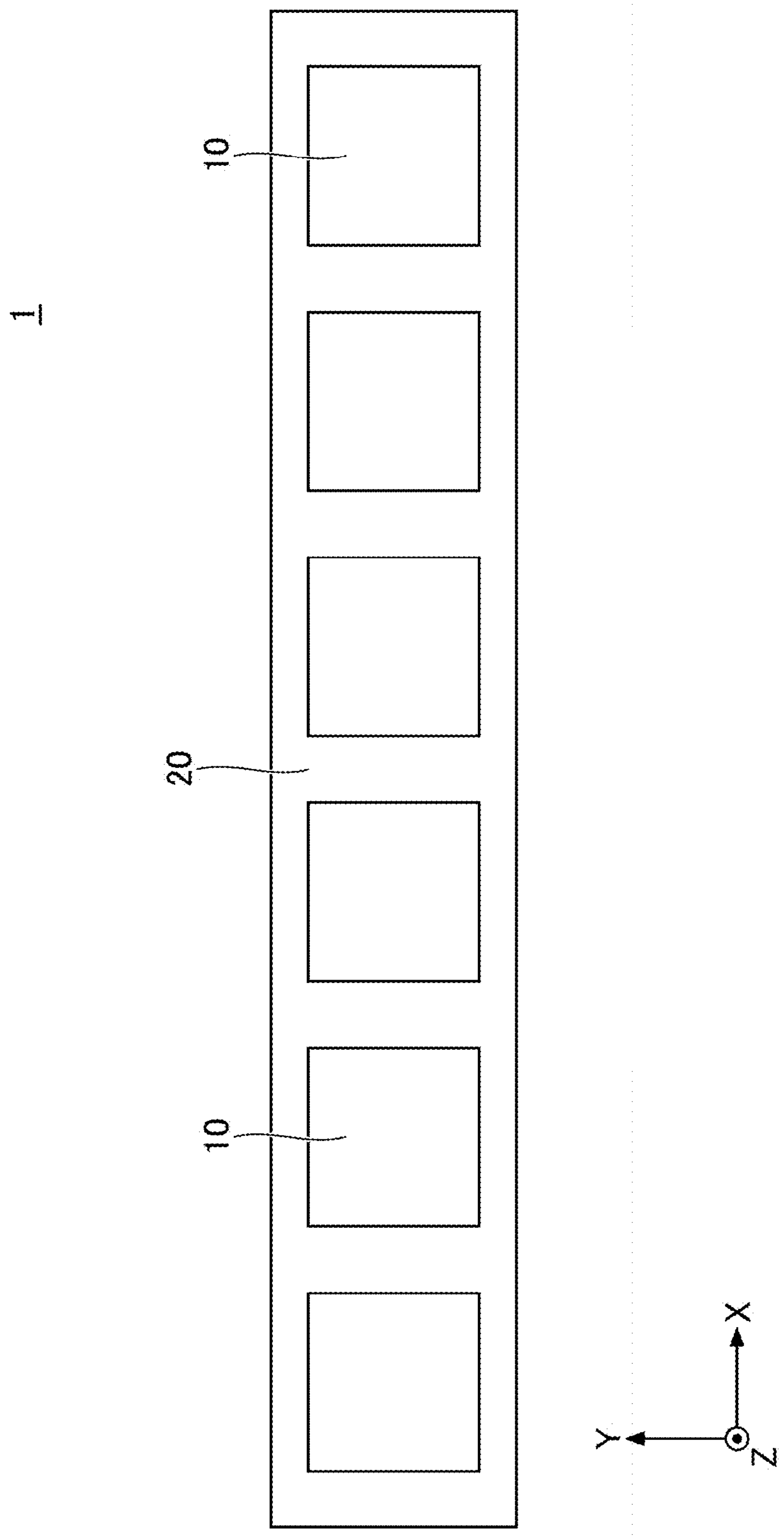
FIG. 1 is a diagram generally illustrating an example of a lead frame according to a first embodiment.

Hereinafter, embodiments will be described in detail with reference to the accompanying drawings. In the specification and the drawings, constituent elements or components having substantially the same functional configuration are designated by the same reference numerals, and a redundant description thereof may be omitted. In the following description, an XYZ orthogonal coordinate system is used, and when viewed from an arbitrary point, a +Z-side may be referred to as an upper side or above, and a −Z-side may be referred to as a lower side or below. In addition, a surface on the lower side may be referred to as one surface or a lower surface, and a surface on the upper side may be referred to as the other surface or an upper surface. However, the coordinate system is defined for the purpose of explaining relative positional relationships of the constituent elements, and orientations of a lead frame and a semiconductor device are not limited by the coordinate system. The lead frame and the semiconductor device can be used in an upside down state, or can be arranged at an arbitrary angle. Further, a plan view of an object indicates a view of the object in a normal direction to one surface of the lead frame or the semiconductor device, and a planar shape of the object indicates a shape of the object in the plan view viewed in the normal direction to the one surface of the lead frame or the semiconductor device.

First Embodiment

First, a first embodiment will be described. The first embodiment relates to a lead frame. The lead frame according to the first embodiment is mounted with a semiconductor element on a surface thereof, and the semiconductor element is encapsulated by an encapsulating resin to form a semiconductor device.

[Structure of Lead Frame]

Figure 2:
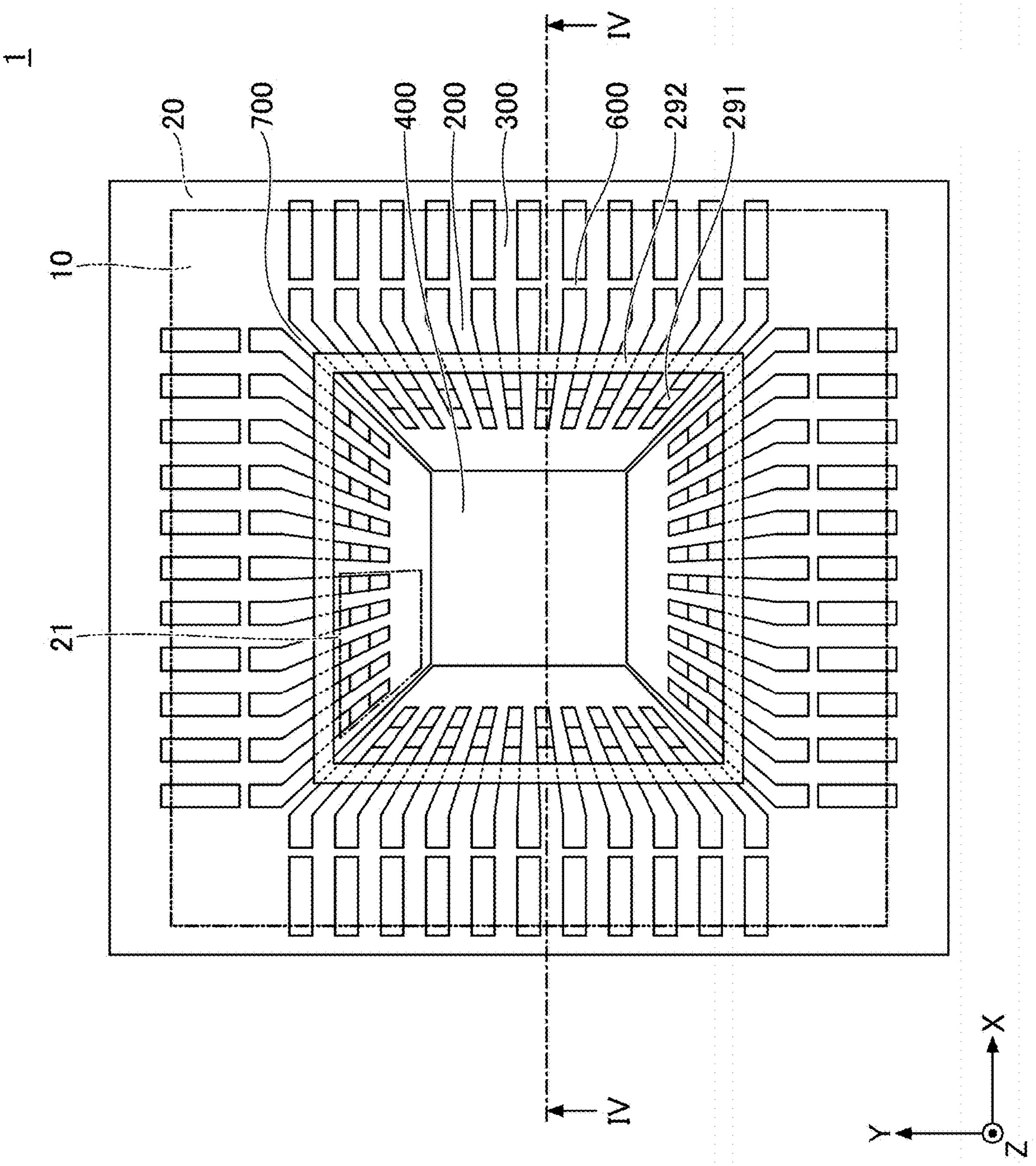
FIG. 2 is a top view illustrating the example of the lead frame according to the first embodiment.
Figure 3A:
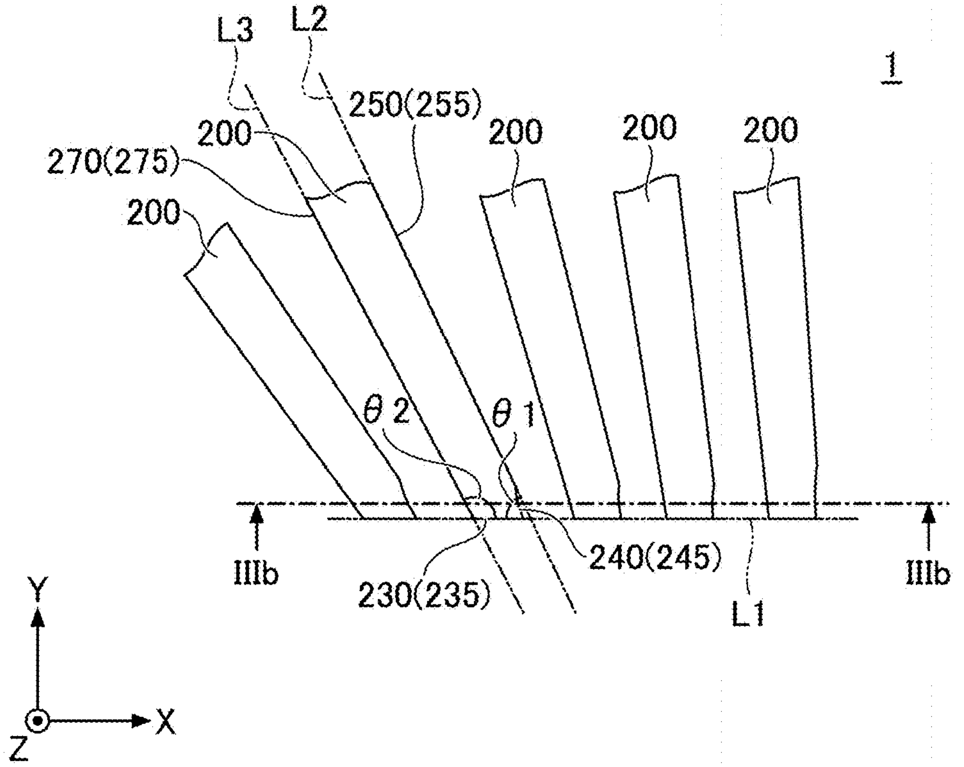
FIG. 3A and FIG. 3B are diagrams illustrating an example of a part illustrated in FIG. 2 on an enlarged scale.
Figure 3B:
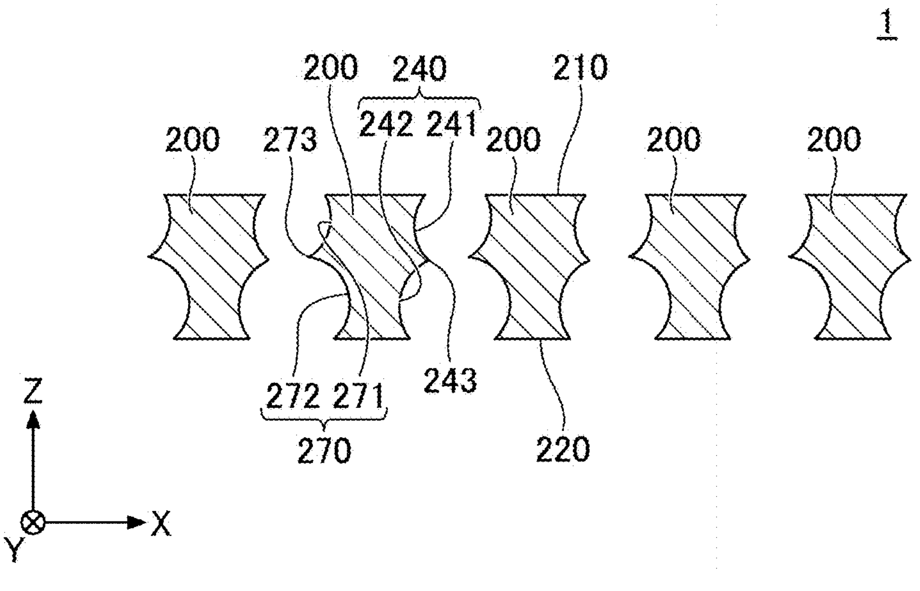
Figure 4:
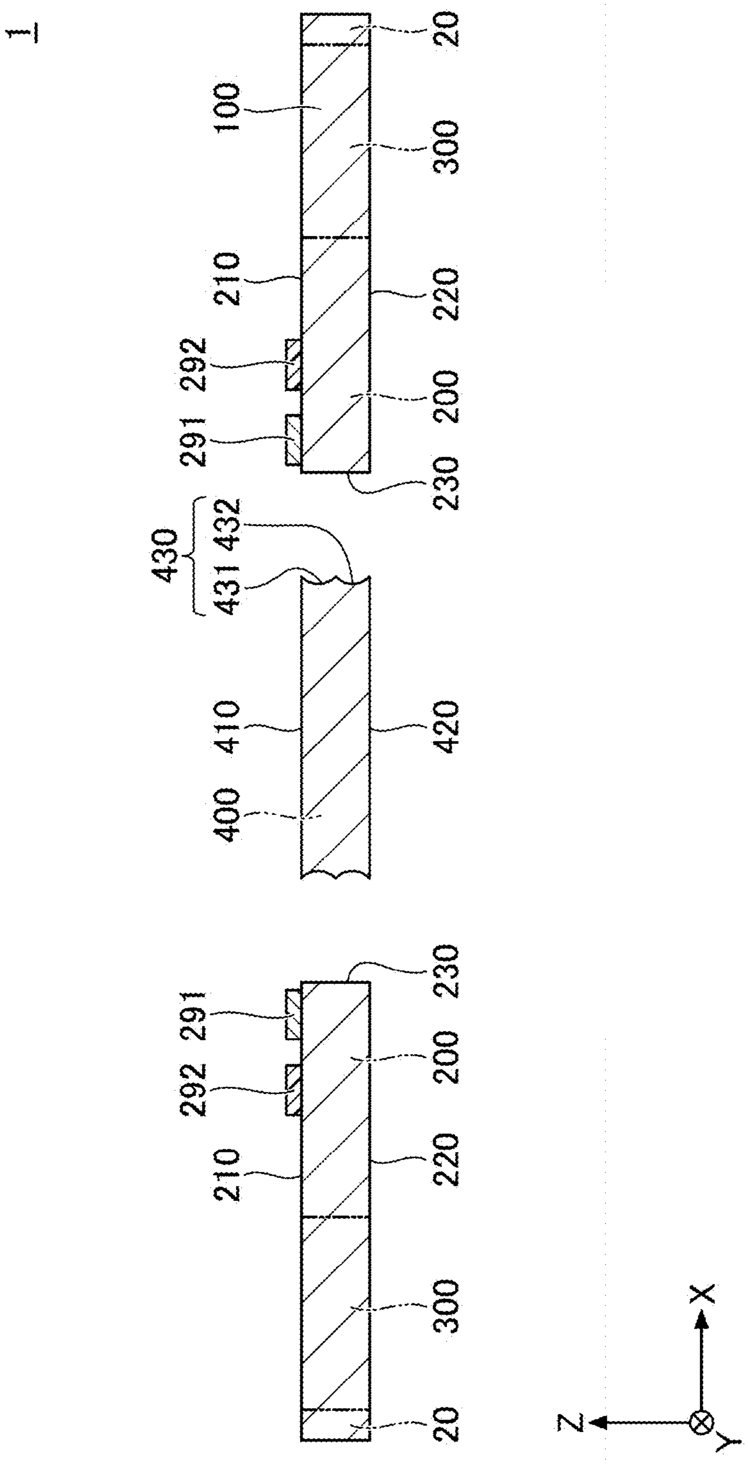
FIG. 4 is a cross sectional view illustrating the example of the lead frame according to the first embodiment.

A structure of the lead frame according to the first embodiment will be described. FIG. 1 is a diagram generally illustrating an example of the lead frame according to the first embodiment. FIG. 2 is a top view illustrating the example of the lead frame according to the first embodiment. FIG. 3A and FIG. 3B are diagrams illustrating an example of a part (a region 21 surrounded by a two-dot chain line) illustrated in FIG. 2 on an enlarged scale. FIG. 3A illustrates a top view of the region 21, and FIG. 3B illustrates a cross sectional view of the region 21. FIG. 3B corresponds to the cross sectional view along a line IIIb-IIIb in FIG. 3A. FIG. 4 is a cross sectional view illustrating the example of the lead frame according to the first embodiment. FIG. 4 corresponds to a cross sectional view along a line IV-IV in FIG. 2.

As illustrated in FIG. 1 through FIG. 3B, a lead frame 1 according to the first embodiment has a structure including a plurality of singulation regions 10 that are connected via a frame portion 20. For example, the singulation region 10 has a rectangular planar shape. The frame portion 20 is provided an outer side each of the singulation regions 10, and includes a portion formed in a picture-frame shape at the outer edge portion of the lead frame 1, and a portion formed in a linear shape between mutually adjacent singulation regions 10. FIG. 2 illustrates one singulation region 10 and the frame portion 20 around the one singulation region 10. As illustrated in FIG. 4, the lead frame 1 includes a metal plate 100. Examples of a material used for the metal plate 100 include copper (Cu), Cu alloys, an alloy 42, or the like, for example. The lead frame 1 may have a thickness in a range of approximately 100 μm to approximately 300 μm, for example.

Each of the singulation regions 10 includes a die pad 400, a plurality of inner leads 200, a plurality of outer leads 300, a dam bar 600, and support bars 700. The dam bar 600 is arranged in a rectangular ring shape along the frame portion 20 in each of the singulation regions 10, so as to surround the die pad 400. The support bars 700 are obliquely arranged in each of the singulation regions 10.

Four corners of the dam bar 600 are connected to four corners of the frame portion 20. The dam bar 600 is provided with the plurality of inner leads 200 and the plurality of outer leads 300. The inner leads 200 extend from the dam bar 600 toward the die pad 400, and the outer leads 300 extend from the dam bar 600 toward the side opposite to the inner leads 200. The support bars 700 are connected to the frame portion 20 at one end thereof, and connected to four corners of the die pad 400 at the other end thereof, to support the die pad 400.

As illustrated in FIG. 4, the die pad 400 has a main surface 410 on which a semiconductor element is mounted, and a main surface 420 opposite to the main surface 410. The main surfaces 410 and 420 are parallel to an XY-plane. The die pad 400 has four side surfaces 430 connecting to the main surfaces 410 and 420. Each of the side surfaces 430 has a concave surface 431 formed on the +Z-side in a thickness direction of the metal plate 100, and a concave surface 432 formed on the −Z-side. Each side surface 430 has a concavo-convex shape associated with the concave surfaces 431 and 432, but two side surfaces 430 are substantially parallel to a YZ-plane, and the other two side surfaces 430 are substantially parallel to a ZX-plane.

The plurality of inner leads 200 are provided on each of the +X-side, the −X-side, the +Y-side, and the −Y-side of the die pad 400. The plurality of inner leads 200 on the +X-side or the −X-side of the die pad 400 are arranged in a Y-axis direction, and the plurality of inner leads 200 on the +Y-side or the −Y-side of the die pad 400 are arranged in an X-axis direction.

A plating film 291 and an adhesive tape 292 are provided on the +Z-side surface of the inner lead 200. The plating film 291 is provided near an end portion of the inner lead 200 for each of the inner leads 200. The plating film 291 is a silver (Ag) film, a gold (Au) film, a nickel (Ni)/Au film (a metal film obtained by laminating a Ni film and a Au film in this order), a Ni/Pd/Au film (a metal film obtained by laminating a Ni film, a Pd film, and a Au film in this order), or the like, for example. The adhesive tape 292 is provided in a ring shape between the plating film 291 of each of the inner leads 200 and the dam bar 600. The adhesive tape 292 is provided for suppressing deformation, such as bending or the like of the inner leads 200. One of the plating film 291 and the adhesive tape 292, or both of the plating film 291 and the adhesive tape 292 may be omitted. In FIG. 3A and FIG. 3B, the illustration of the plating film 291 and the adhesive tape 292 is omitted for the sake of convenience.

Next, the plurality of inner leads 200 located on the +Y-side of the die pad 400 will be described in detail. As illustrated in FIG. 3A and FIG. 3B, the inner lead 200 has main surfaces 210 and 220 parallel to the XY-plane. The main surfaces 210 and 220 are parallel to the X-axis direction and the Y-axis direction. For example, the main surface 210 coincides with (that is, lies on the same, common plane as) the main surface 410, and the main surface 220 coincides with (that is, lies on the same, common plane as) the main surface 420. The plating film 291 and the adhesive tape 292 are provided on the main surface 210, and a bonding wire 44 (refer to FIG. 16) is connected to the plating film 291. The main surface 210 is an example of a first main surface, and the main surface 220 is an example of a second main surface.

The inner lead 200 has an end surface 230. The end surface 230 opposes the side surface 430 located on the +Y-side of the die pad 400. The end surface 230 connects to the main surfaces 210 and 220. The end surface 230 is formed by punching as will be described later, and an angle between the end surface 230 and each of the main surfaces 210 and 220 is approximately 90 degrees. The end surfaces 230 of the plurality of inner leads 200 coincide (that is, lie on the same, common plane).

The inner lead 200 has side surfaces 240 and 250. The side surface 240 connects to the main surfaces 210 and 220 and to the end surface 230. For example, the side surface 240 is formed at a position closer to the die pad 400 than the portion of the main surface 210 formed with the plating film 291 (refer to FIG. 2). The side surface 240 may be formed from the end surface 230 to a proximal portion of the main surface 210 formed with the plating film 291. The side surface 240 may be formed from the end surface 230 to a portion of the main surface 210 on which the plating film 291 is formed. The side surface 240 has a concave surface 241 formed on the +Z-side in the thickness direction of the metal plate 100, and a concave surface 242 formed on the −Z-side in the thickness direction of the metal plate 100. The concave surface 241 and the concave surface 242 are connected, and a pointed convex portion 243 is formed at a boundary between the concave surface 241 and the concave surface 242. The convex portion 243 is located at a position on the +Z-side than a center of the metal plate 100 in the thickness direction, for example. The side surface 250 connects to the main surfaces 210 and 220 and to the side surface 240. Although not illustrated, the side surface 250 has a concave surface formed on the +Z-side in the thickness direction of the metal plate 100, and a concave surface formed on the −Z-side in the thickness direction of the metal plate 100. These two concave surfaces of the side surface 250 are connected, and a pointed convex portion is formed at a boundary between these two concave surfaces. The convex portion of the side surface 250 is located at a position on the +Z-side than the center of the metal plate 100 in the thickness direction, for example. The side surface 240 is an example of a first side surface, and the side surface 250 is an example of a second side surface.

The inner lead 200 has a side surface 270. The side surface 270 connects to the main surfaces 210 and 220, and to the end surface 230 on the side opposite to the side surface 240. The side surface 270 has a concave surface 271 formed on the +Z-side in the thickness direction of the metal plate 100, and a concave surface 272 formed on the −Z-side in the thickness direction of the metal plate 100. The concave surface 271 and the concave surface 272 are connected, and a pointed convex portion 273 is formed at a boundary between the concave surface 271 and the concave surface 272. The convex portion 273 is located at a position on the +Z-side of the center of the metal plate 100 in the thickness direction, for example. The side surface 270 is an example of a fourth side surface.

In the plan view perpendicular to the main surface 210, an angle θ1 between an imaginary (or virtual) straight line L1 including a line of intersection 235 of the main surface 210 and the end surface 230, and an imaginary straight line L2 including a line of intersection 255 of the main surface 210 and the side surface 250, is less than 90° on the side of the inner lead 200. In addition, a line of intersection 245 between the main surface 210 and the side surface 240 is located on the side of the inner lead 200 than the imaginary straight line L1 and the imaginary straight line L2. For example, the line of intersection 245 is a curve that is concave toward the inside of the inner lead 200. The angle θ1 may be larger for the inner lead 200 located at the center along the X-axis direction. The imaginary straight line L1 is an example of a first imaginary straight line, and the imaginary straight line L2 is an example of a second imaginary straight line. The line of intersection 235 is an example of a first line of intersection, the line of intersection 255 is an example of a second line of intersection, and the line of intersection 245 is an example of a third line of intersection.

In the plan view perpendicular to the main surface 210, an angle θ2 between the imaginary straight line L1 and an imaginary straight line L3 including a line of intersection 275 between the main surface 210 and the side surface 270 is 90° or greater on the side of the inner lead 200. The angle θ2 may be smaller for the inner lead 200 located at the center along the X-axis direction. The imaginary straight line L3 is an example of a third imaginary straight line. The line of intersection 275 is an example of a fourth line of intersection.

A width of the inner lead 200 may vary in a longitudinal direction. For example, the width of the inner lead 200 may increase as a distance from the die pad 400 increases. In a range including the side surface 250 in the longitudinal direction, the width of the inner lead 200 may be wider at the main surface 210 than at the main surface 220. The width of the inner lead 200 refers to a length in a short direction perpendicular to the longitudinal direction at each position along the longitudinal direction.

The plurality of inner leads 200 located on the −Y-side of the die pad 400 correspond to the plurality of inner leads 200 located on the +Y-side of the die pad 400 rotated by 180 degrees around a center of the die pad 400 as a rotation axis, for example. The plurality of inner leads 200 located on the +X-side or the −X-side of the die pad 400 correspond to the plurality of inner leads 200 located on the +Y-side of the die pad 400 rotated clockwise or counterclockwise by 90 degrees around the center of the die pad 400 as the rotation axis, for example.

[Method for Manufacturing Lead Frame]

Figure 5:
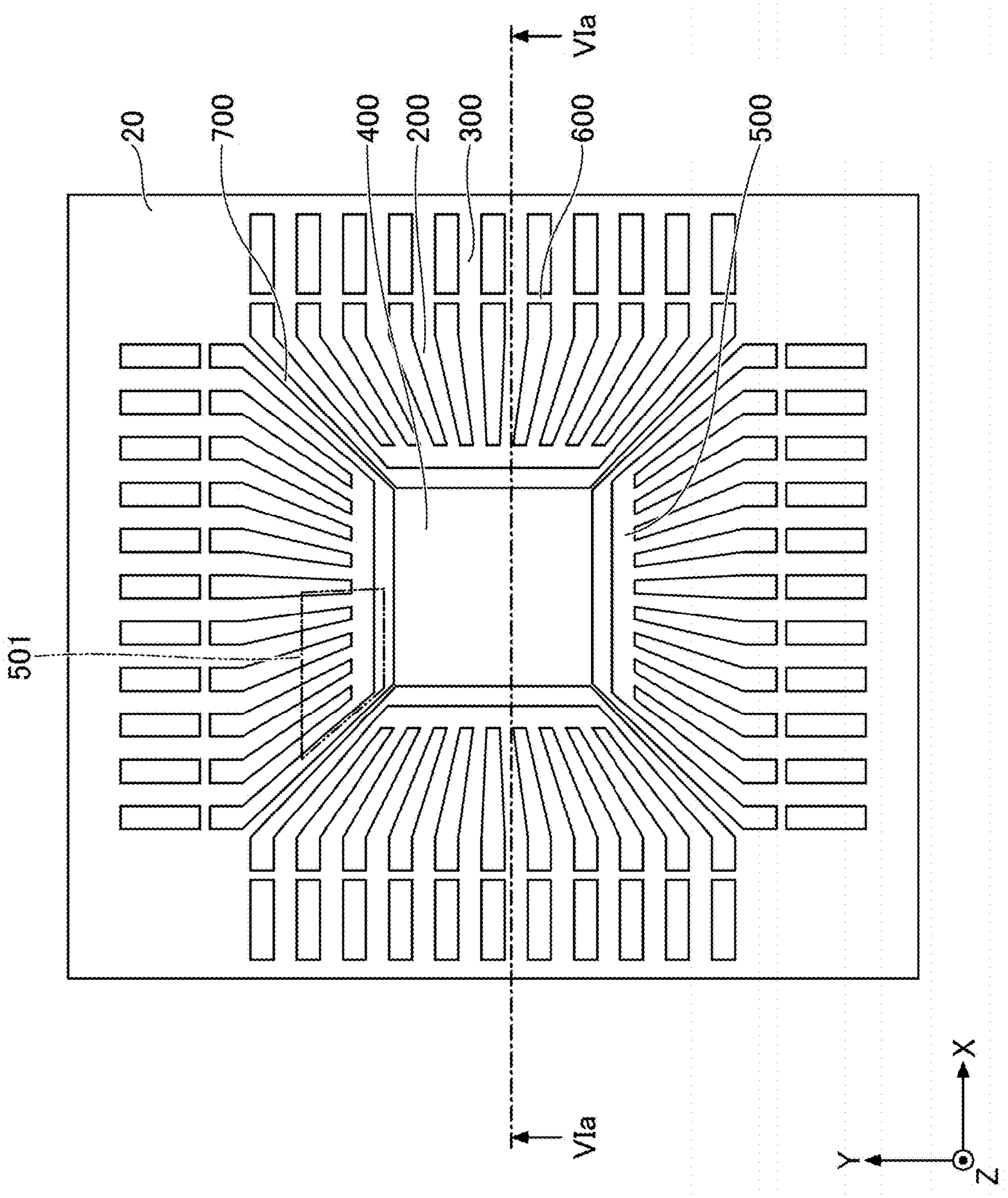
FIG. 5 is a top view (part 1) illustrating an example of a method for manufacturing the lead frame according to the first embodiment.

Next, a method for manufacturing the lead frame 1 according to the first embodiment will be described. FIG. 5 is a top view illustrating an example of the method for manufacturing the lead frame according to the first embodiment. FIG. 6A through FIG. 7C are cross sectional views illustrating the example of the method for manufacturing the lead frame according to the first embodiment. FIG. 8A through FIG. 9B are top views illustrating the example of the method for manufacturing the lead frame according to the first embodiment, illustrating changes in a part (a region 501 surrounded by a two-dot chain line) in FIG. 5. FIG. 10A through FIG. 11B are cross sectional views illustrating the example of the method for manufacturing the lead frame according to the first embodiment. FIG. 6A through FIG. 7C illustrate changes in a cross section along a line VIa-VIa in FIG. 5. FIG. 10A through FIG. 11B illustrate changes in a cross section along a line Xa-Xa in FIG. 8A. The region 501 illustrated in FIG. 5 corresponds to the region 21 illustrated in FIG. 2.

Figure 6A:
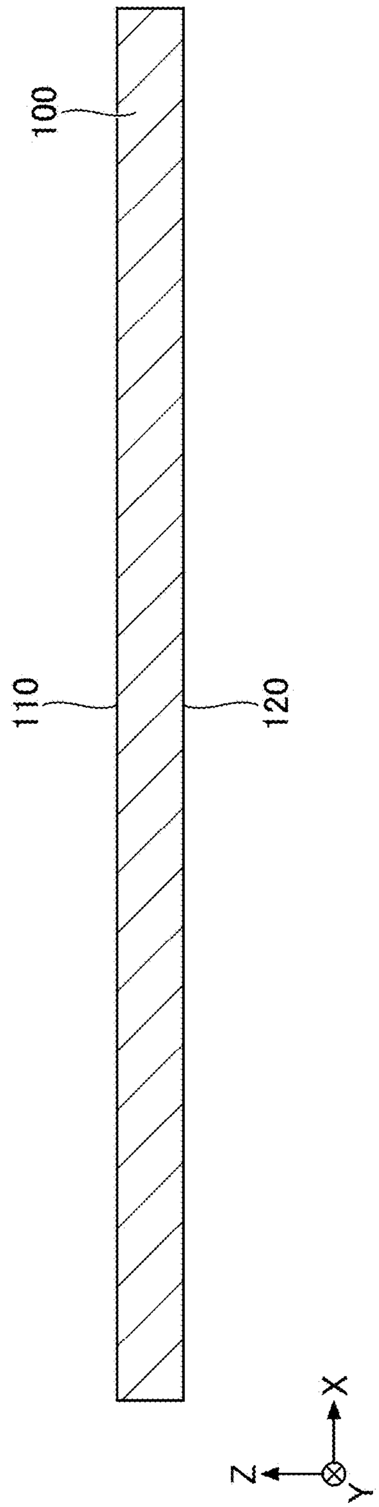
FIG. 6A, FIG. 6B, and FIG. 6C are cross sectional views (part 1) illustrating the example of the method for manufacturing the lead frame according to the first embodiment.

First, as illustrated in FIG. 6A, the metal plate 100 formed of a metal and having a predetermined shape is prepared. Examples of the material used for the metal plate 100 include copper, copper alloys, an alloy 42, or the like, for example. The metal plate 100 may have a thickness in a range of approximately 100 μm to approximately 300 μm, for example. The metal plate 100 has one main surface 110 and the other main surface 120.

Figure 6B:
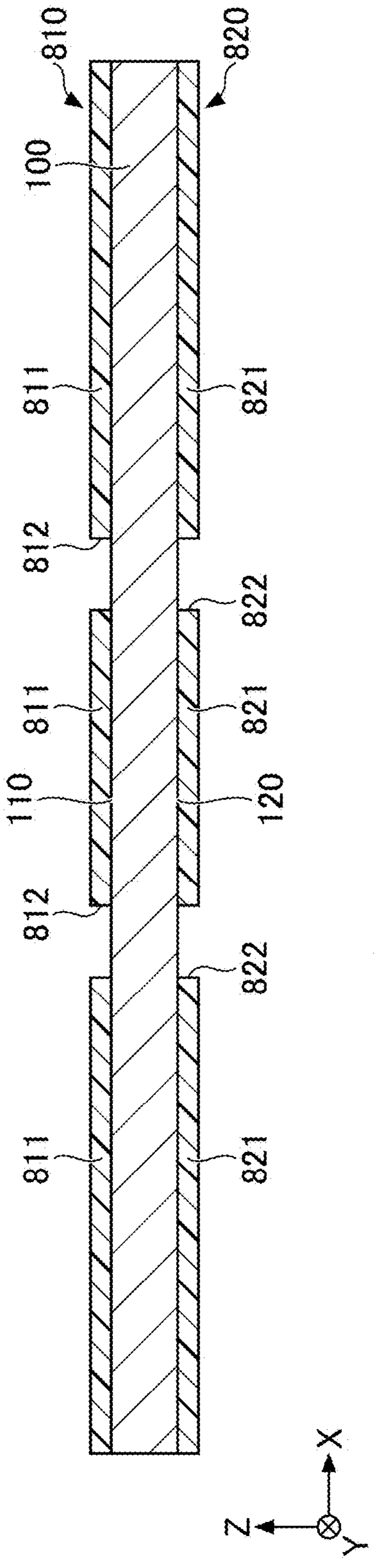
Figure 8A:
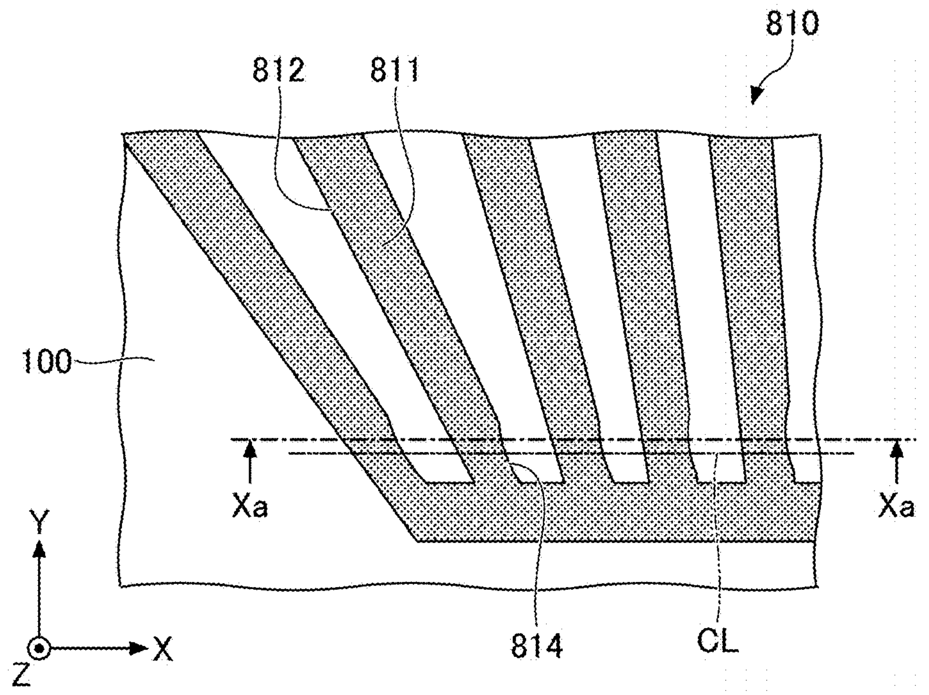
FIG. 8A and FIG. 8B are top views (part 2) illustrating the example of the method for manufacturing the lead frame according to the first embodiment.
Figure 10A:
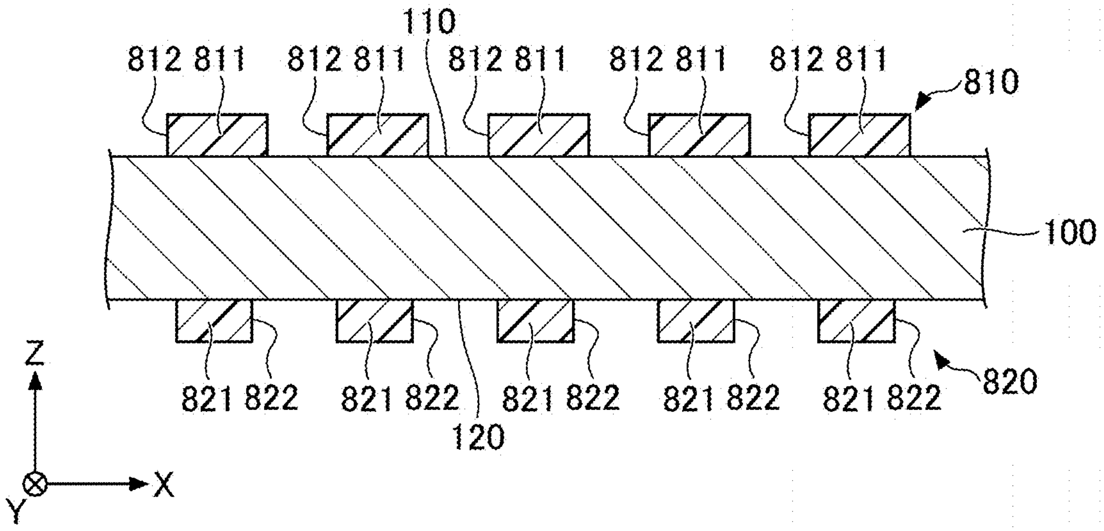
FIG. 10A and FIG. 10B are cross sectional views (part 3) illustrating the example of the method for manufacturing the lead frame according to the first embodiment.

Next, as illustrated in FIG. 6B, FIG. 8A, and FIG. 10A, a photosensitive resist 810 is formed on the main surface 110 of the metal plate 100, and a photosensitive resist 820 is formed on the main surface 120 of the metal plate 100. The photosensitive resists 810 and 820 may be formed by coating a photosensitive resist liquid and thereafter drying, or by attaching a photosensitive resist film. Examples of the photosensitive resists 810 and 820 include a dry film resist, an electrodeposition resist, or the like, such as an epoxy resin, an acrylic resin, or the like, for example.

Next, the photosensitive resist 810 is exposed and developed to form a covering pattern 811 and an opening 812 in the photosensitive resist 810, and the photosensitive resist 820 is exposed and developed to form a covering pattern 821 and an opening 822 in the photosensitive resist 820. The covering pattern 811 covers portions of the main surface 110 where the frame portion 20, the inner leads 200, the outer leads 300, the die pad 400, connecting parts 500 (refer to FIG. 5), the dam bars 600, and the support bars 700 are formed. The opening 812 is a portion for forming an opening in the metal plate 100, and the remaining portion of the main surface 110 is exposed from the opening 812. The covering pattern 821 covers portions of the main surface 120 where the frame portion 20, the inner leads 200, the outer leads 300, the die pad 400, the connecting parts 500, the dam bars 600, and the support bars 700 are formed. The opening 822 is a portion for forming an opening in the metal plate 100, and the remaining portion of the main surface 120 is exposed from the opening 822. In a region where a portion including the side surface 250 is formed in the longitudinal direction of the inner lead 200, a width of the covering pattern 811 is wider than a width of the covering pattern 821, and a width of the opening 812 is narrower than a width of the opening 822.

The covering pattern 811 and the opening 812 of the photosensitive resist 810, and the covering pattern 821 and the opening 822 of the photosensitive resist 820, include four connection patterns for forming the connecting parts 500. A first connecting part 500 has a longitudinal direction thereof extending in the X-axis direction, and connects the end portions of the plurality of inner leads 200 formed on the +Y-side of the die pad 400. A second connecting part 500 has a longitudinal direction thereof extending in the Y-axis direction, and connects the end portions of the plurality of inner leads 200 formed on the +X-side of the die pad 400. A third connecting part 500 has a longitudinal direction thereof extending in the X-axis direction, and connects the end portions of the plurality of inner leads 200 formed on the −Y-side of the die pad 400. A fourth connecting part 500 has a longitudinal direction thereof extending in the Y-axis direction, and connects the end portions of the plurality of inner leads 200 formed on the −X-side of the die pad 400. The four connection patterns are formed so that the four, that is, the first through fourth connection parts 500 can be formed.

The connecting part 500 is removed later by cutting the metal plate 100, but a cutting line CL at the time of cutting overlaps the end surface 230 of the inner lead 200 in a plan view. Further, the covering pattern 811 and the opening 812 are formed such that the angle θ1 between the imaginary straight line L1 and the imaginary straight line L2 is less than 90° on the side of the inner lead 200, and the line of intersection 245 is located on the side of the inner lead 200 than the imaginary straight line L1 and the imaginary straight line L2 (refer to FIG. 3A). For example, as illustrated in FIG. 8A, the covering pattern 811 includes a recess 814 for forming the side surface 240. The recess 814 intersects the cutting line CL.

Figure 6C:
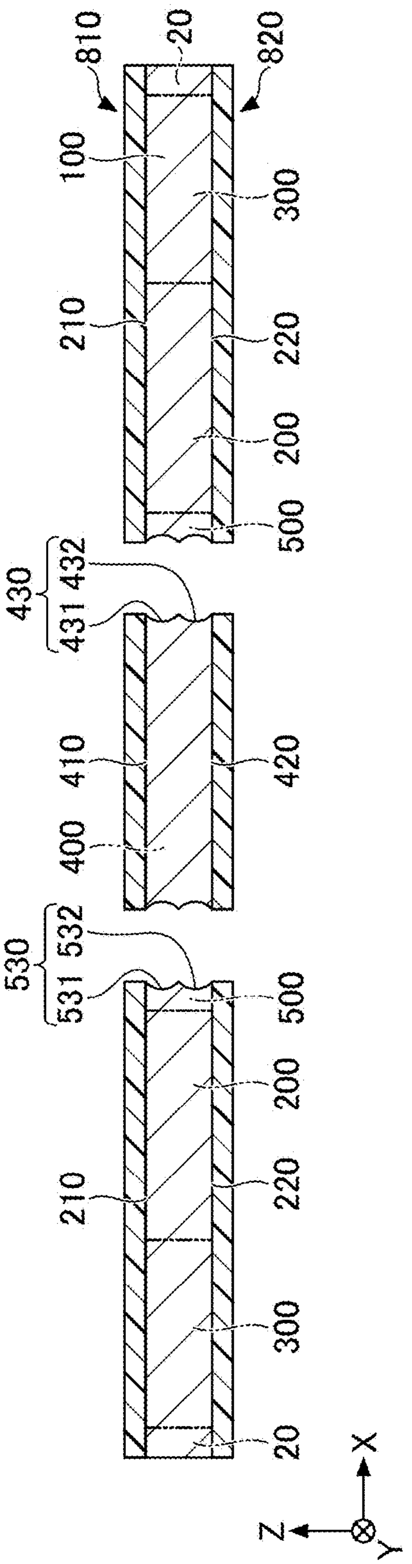
Figure 8B:
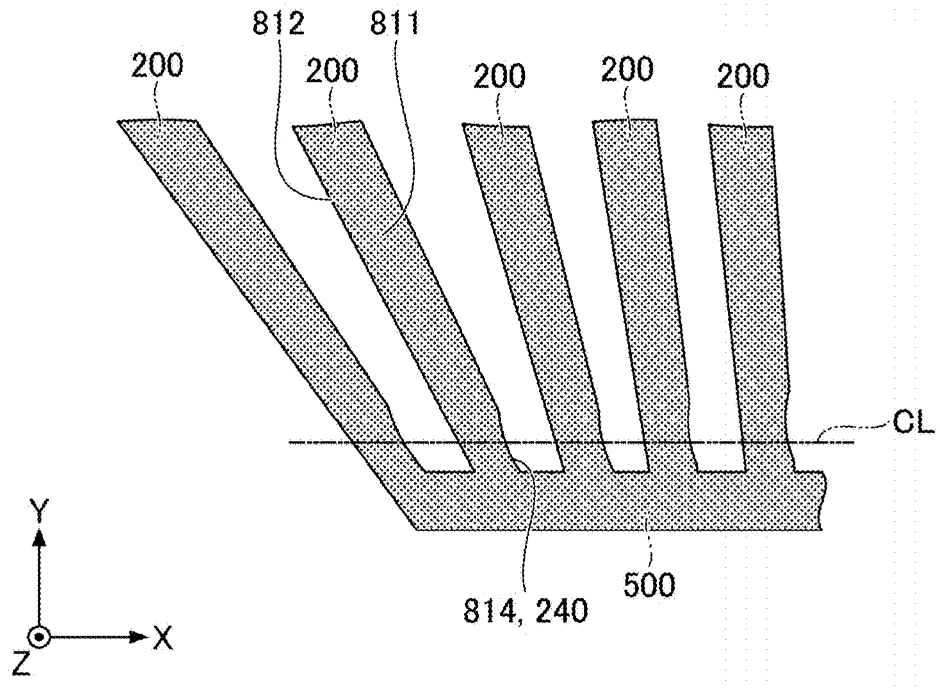
Figure 10B:
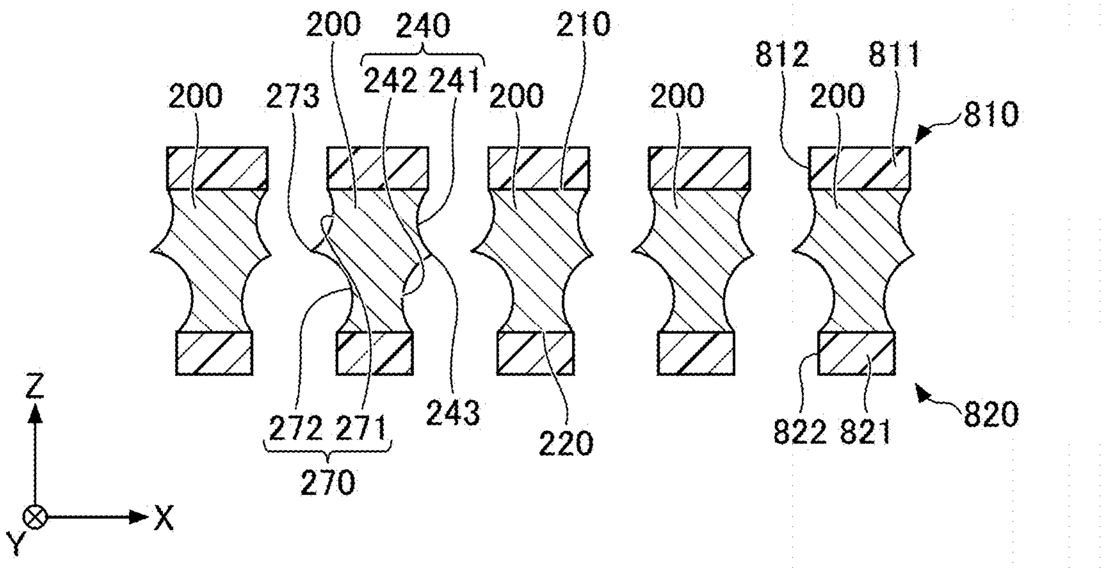

Next, as illustrated in FIG. 6C, FIG. 8B, and FIG. 10B, the metal plate 100 is half-etched from the main surface 110 and half-etched from the main surface 120, using the photosensitive resists 810 and 820 as etching masks. The half-etching of the metal plate 100 is a wet etching. In a case where the metal plate 100 is formed of copper, for example, an aqueous solution of ferric chloride or cupric chloride can be used as an etchant for the half-etching of the metal plate 100.

As a result, the frame portion 20, the inner leads 200, the outer leads 300, the die pad 400, the connecting parts 500, the dam bars 600, and the support bars 700 are formed on the metal plate 100. In this state, the side surface 240 is formed to intersect the cutting line CL. As illustrated in FIG. 6C, each connecting part 500 has a side surface 530 opposing the side surface 430 of the die pad 400. Each side surface 530 has a concave surface 531 formed on the +Z-side in the thickness direction of the metal plate 100, and a concave surface 532 formed on the −Z-side in the thickness direction of the metal plate 100.

Next, as illustrated in FIG. 5, FIG. 7A, FIG. 9A, and FIG. 11A, the photosensitive resists 810 and 820 are removed. The photosensitive resists 810 and 820 can be removed using a stripping solution, for example.

Figure 7A:
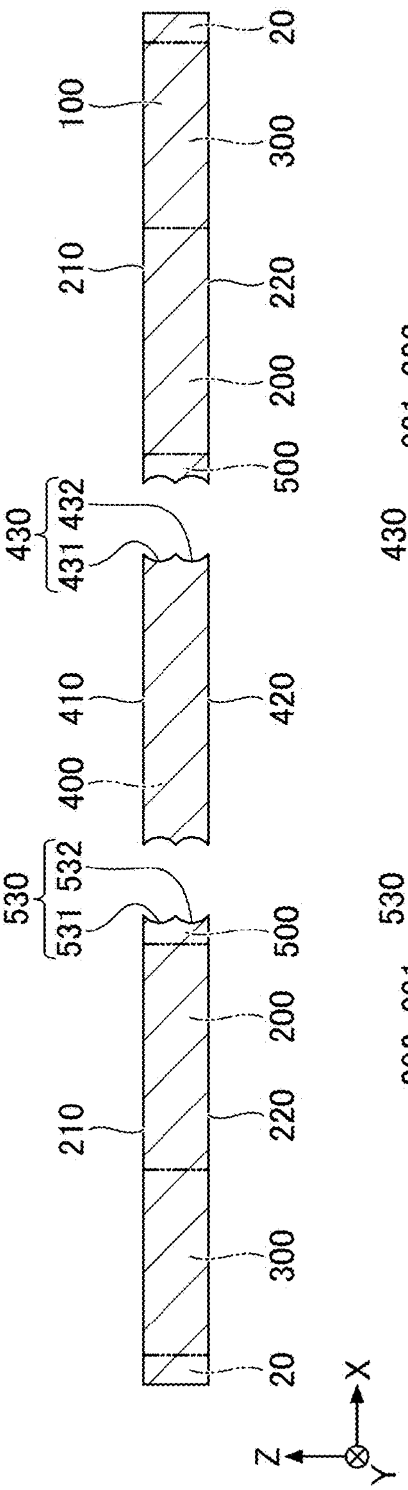
FIG. 7A, FIG. 7B, and FIG. 7C are cross sectional views (part 2) illustrating the example of the method for manufacturing the lead frame according to the first embodiment.
Figure 7B:
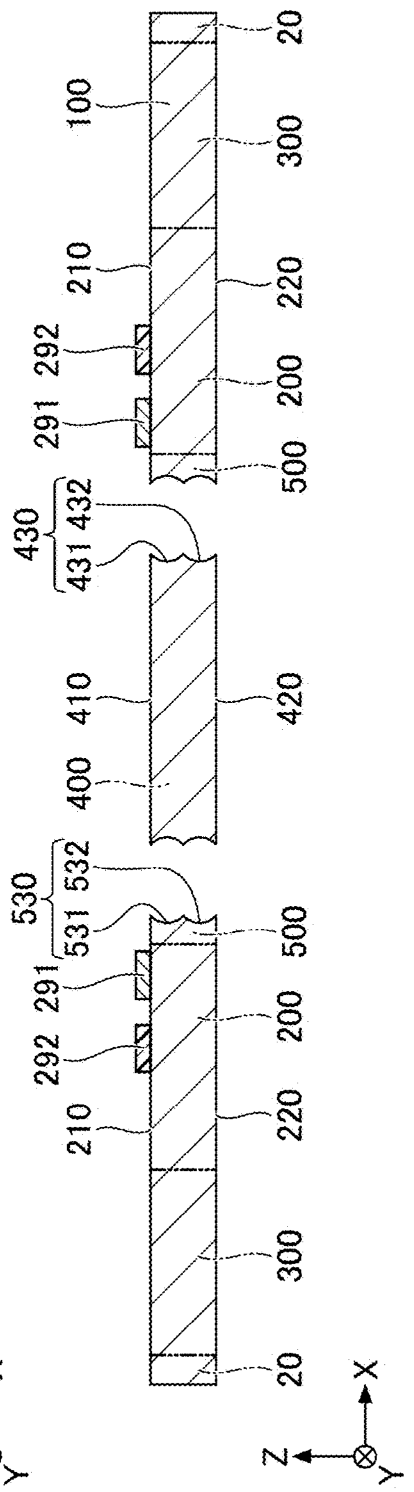
Figure 9A:
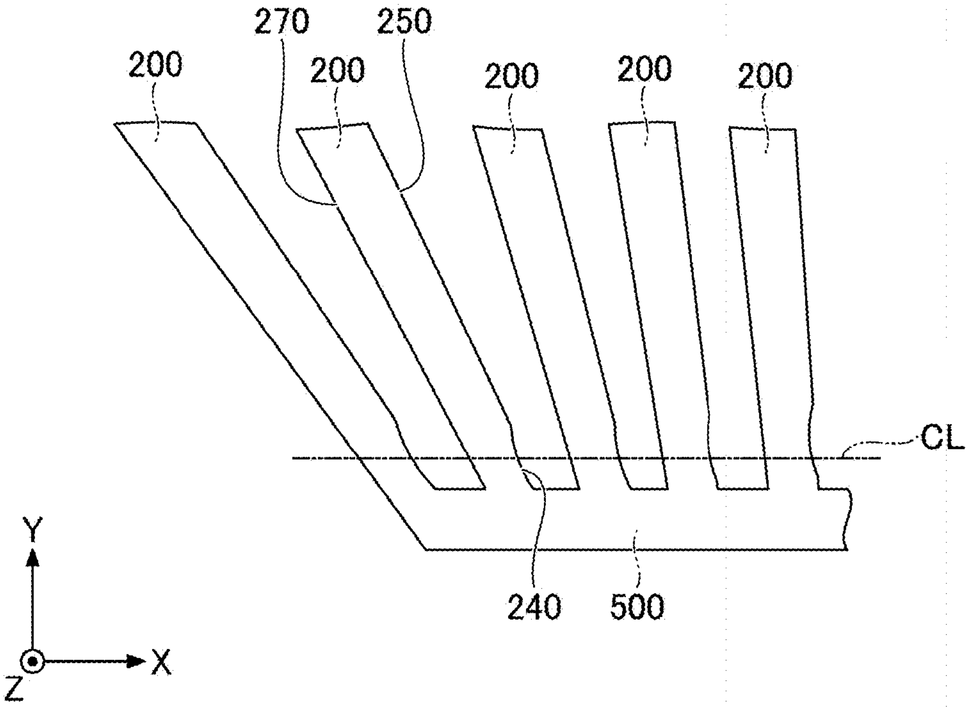
FIG. 9A and FIG. 9B are top views (part 3) illustrating the example of the method for manufacturing the lead frame according to the first embodiment.
Figure 9B:
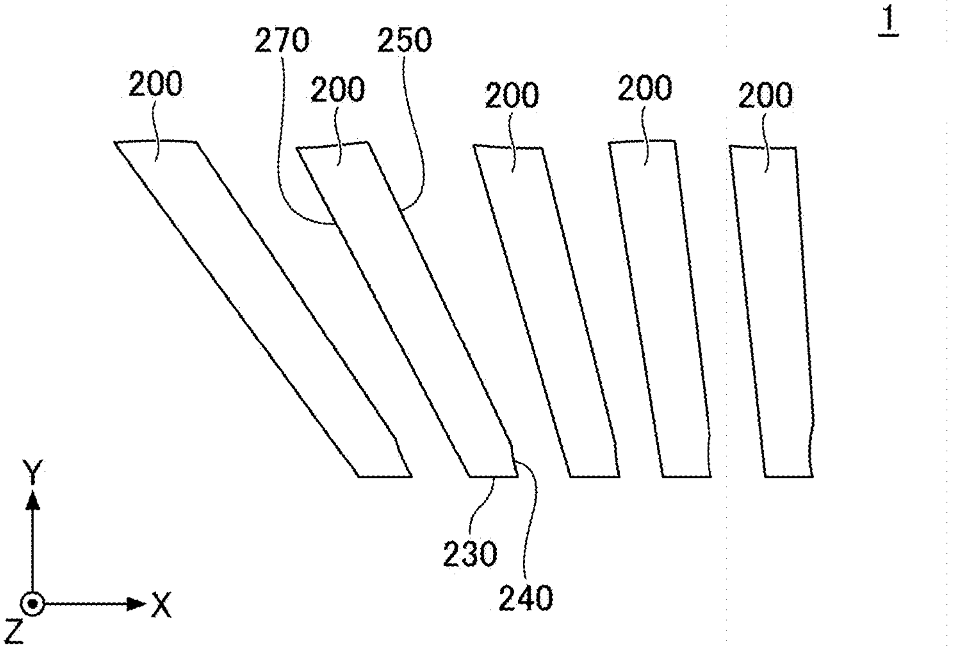

Next, as illustrated in FIG. 7B, the plating film 291 is formed on the main surface 210 of the inner lead 200, and the adhesive tape 292 is attached to the main surface 210 of the inner lead 200. The plating film 291 may be formed by electrolytic plating, for example. In FIG. 9A and FIG. 9B, the illustration of the plating film 291 and the adhesive tape 292 is omitted for the sake of convenience.

Figure 7C:
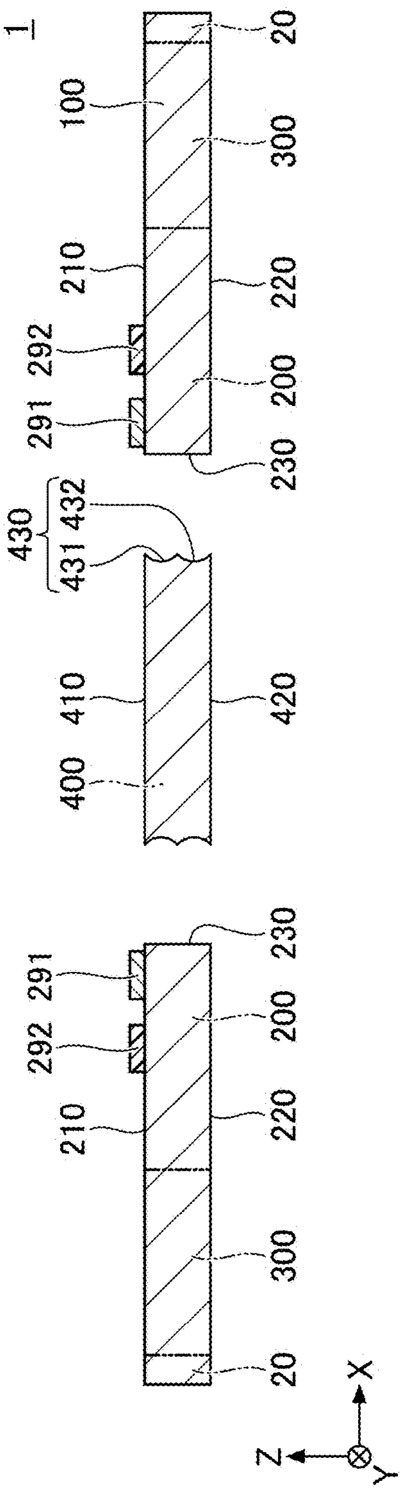
Figure 11A:
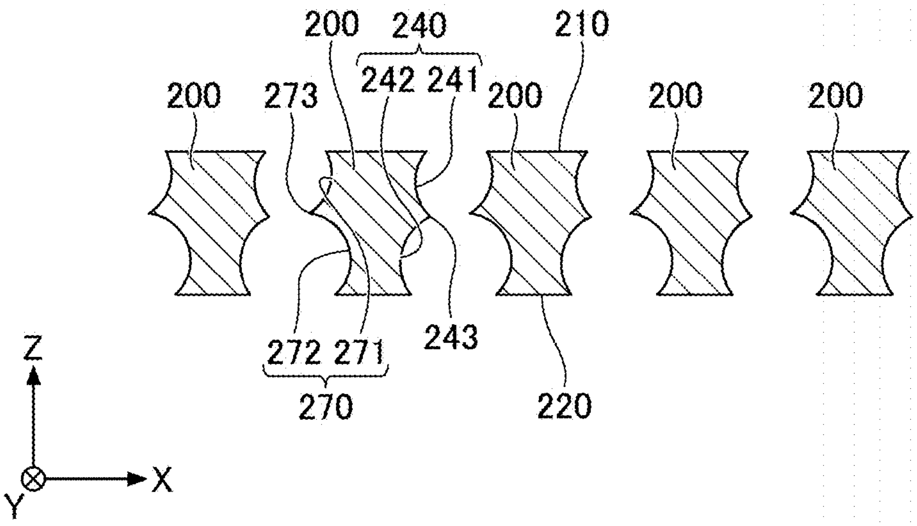
FIG. 11A and FIG. 11B are cross sectional views (part 4) illustrating the example of the method for manufacturing the lead frame according to the first embodiment.
Figure 11B:
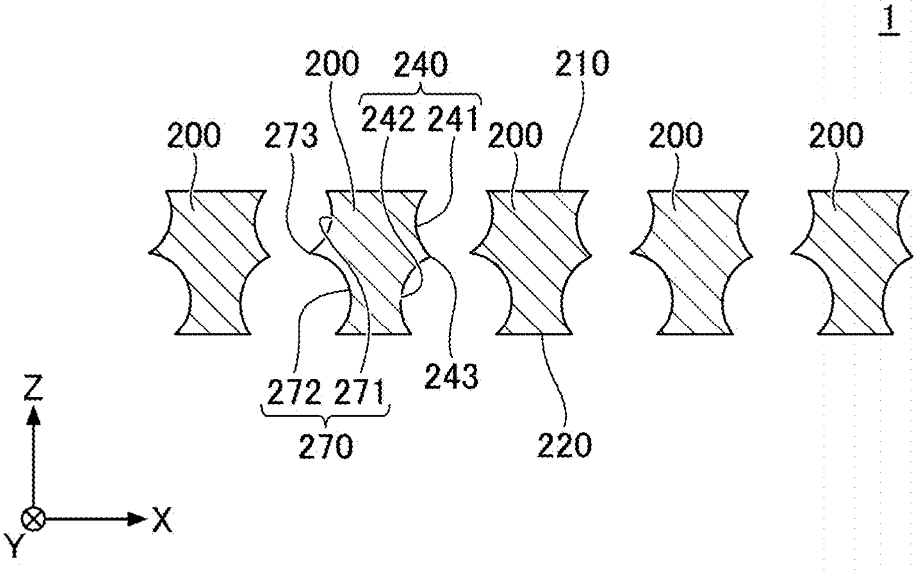

Next, as illustrated in FIG. 7C and FIG. 9B, the metal plate 100 is cut along the cutting line CL to remove the connecting part 500 and the tip portion of the inner lead 200. This cutting may perform punching using a die, for example. In this case, as illustrated in FIG. 11B, no burr is formed on a cutting surface and in a vicinity thereof.

The lead frame 1 according to the first embodiment can be manufactured by the processes described above.

[Effects of Lead Frame]

Next, the effects (or advantageous features) of the lead frame 1 will be described with reference to a reference example. FIG. 12A through FIG. 13B are top views illustrating an example of the method for manufacturing the lead frame according to a reference example. FIG. 14A through FIG. 15B are cross sectional views illustrating the example of the method for manufacturing the lead frame according to the reference example. FIG. 14A through FIG. 15B illustrate changes in a cross section along a line XIVa-XIVa in FIG. 12A.

In FIG. 12A through FIG. 15B, constituent elements that are substantially the same as the constituent elements of the first embodiment are designated by the same reference numerals with a subscript “X”.

Figure 13A:
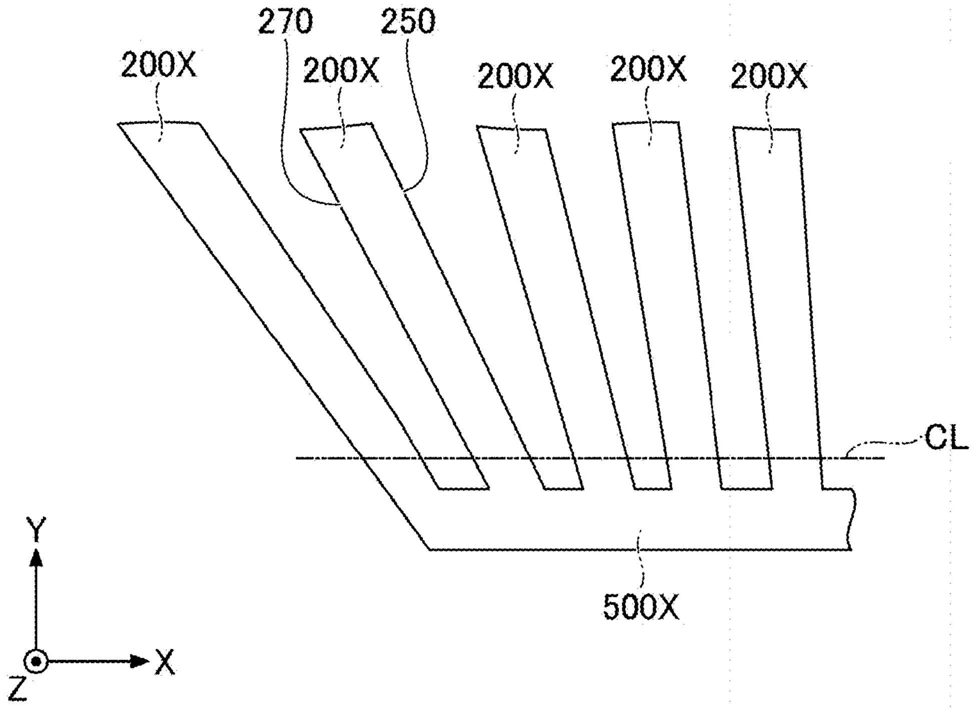
FIG. 13A and FIG. 13B are top views (part 2) illustrating the example of the method for manufacturing the lead frame according to the reference example.
Figure 13B:
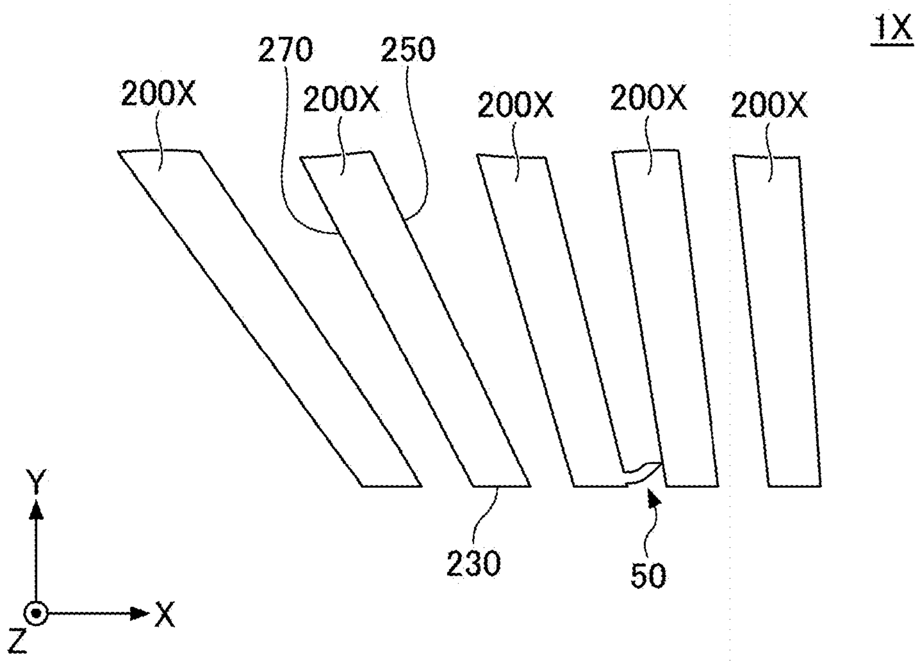
Figure 15A:
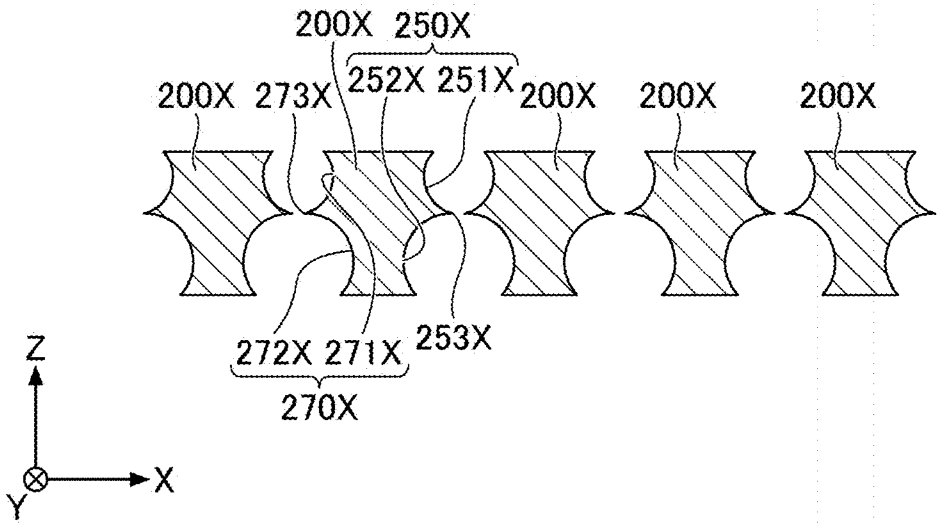
FIG. 15A and FIG. 15B are cross sectional views (part 2) illustrating the example of the method for manufacturing the lead frame according to the reference example.
Figure 15B:
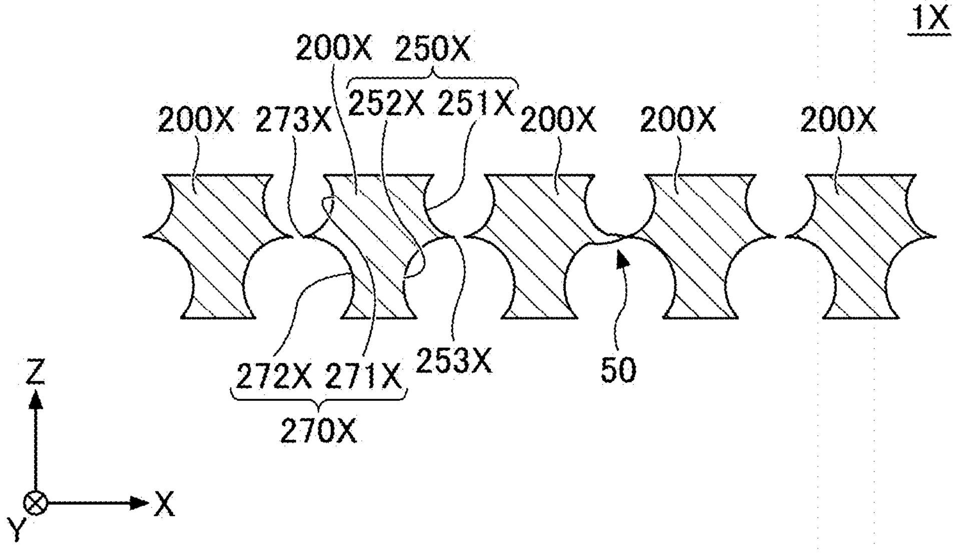

As illustrated in FIG. 13B and FIG. 15B, a lead frame 1X according to the reference example differs from the lead frame 1 in that the side surface 240 is not formed on an inner lead 200X, and that the side surface 250 connects directly to the end surface 230.

Figure 12A:
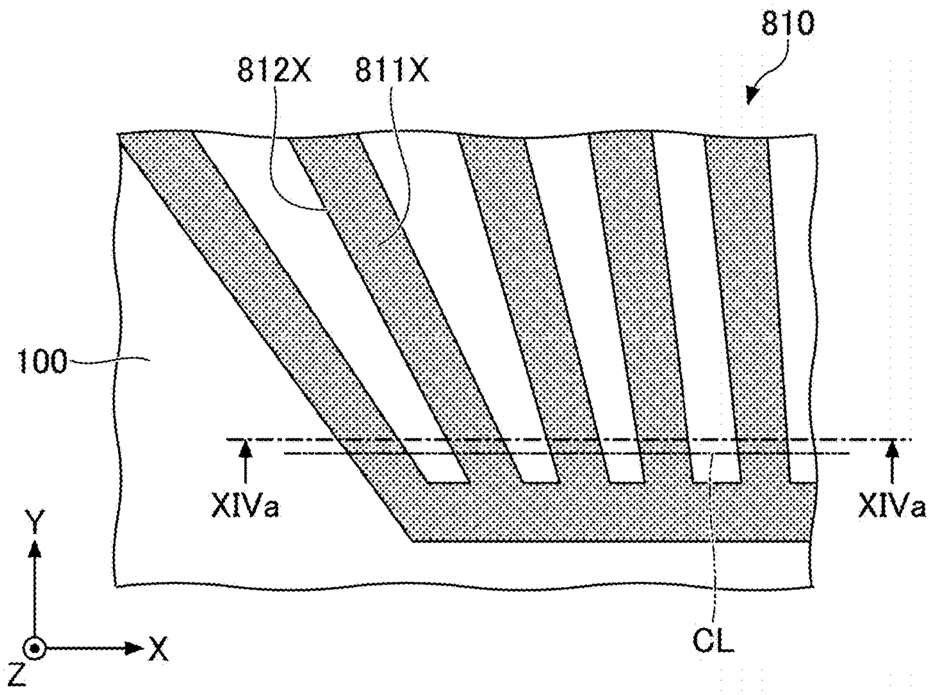
FIG. 12A and FIG. 12B are top views (part 1) illustrating an example of the method for manufacturing the lead frame according to a reference example.
Figure 14A:
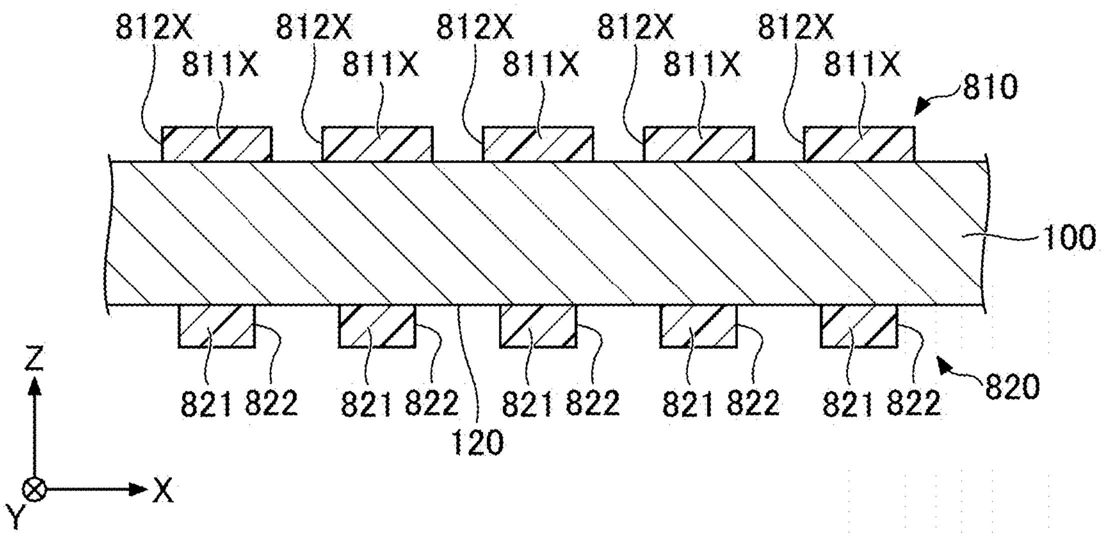
FIG. 14A and FIG. 14B are cross sectional views (part 1) illustrating the example of the method for manufacturing the lead frame according to the reference example.

When manufacturing the lead frame 1X, as illustrated in FIG. 12A and FIG. 14A, a covering pattern 811X and an opening 812X are formed in the photosensitive resist 810 in place of the covering pattern 811 and the opening 812. As illustrated in FIG. 12A, the covering pattern 811X does not include the recess 814.

Figure 12B:
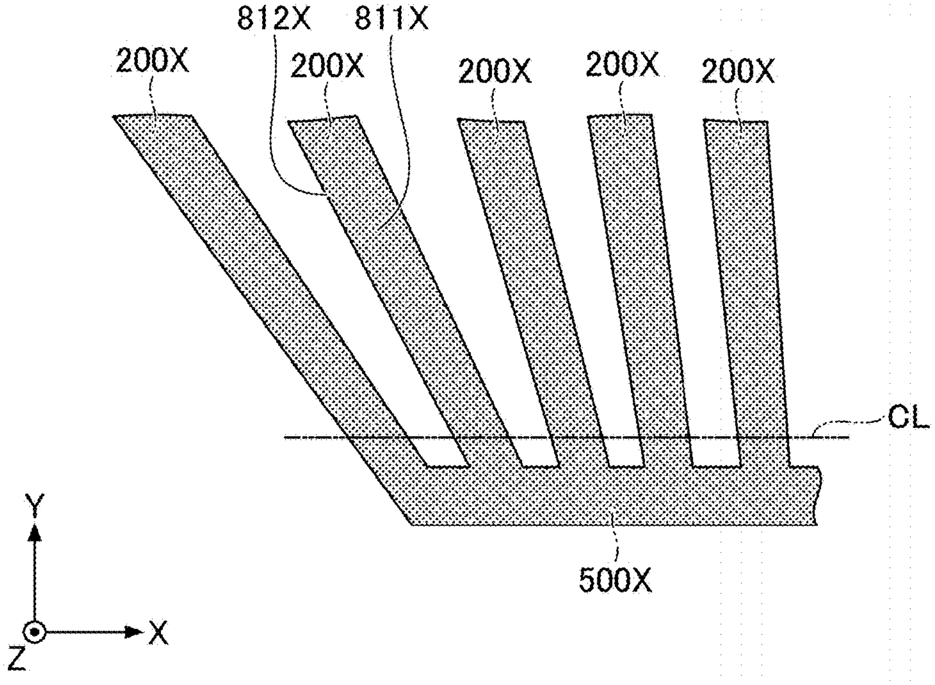
Figure 14B:
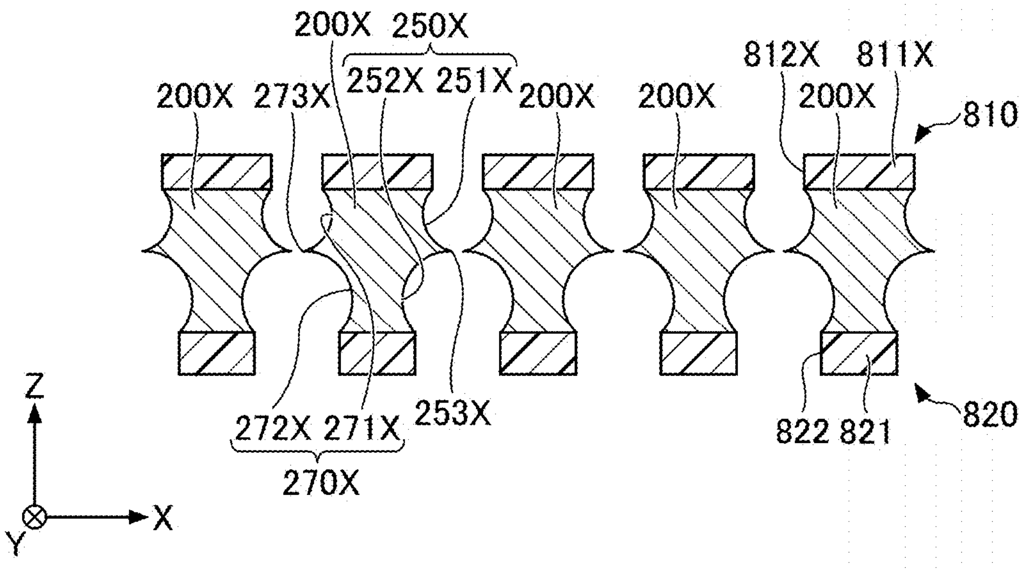

After the covering pattern 811X and the opening 812X are formed in the photosensitive resist 810 and the covering pattern 821 and the opening 822 are formed in the photosensitive resist 820, as illustrated in FIG. 12B and FIG. 14B, the metal plate 100 is half-etched from the main surface 110 of the metal plate 100 and from the main surface 120 of the metal plate 100 using the photosensitive resists 810 and 820 as etching masks.

As a result, the frame portion 20, inner leads 200X, the outer leads 300, the die pad 400, connecting parts 500X, the dam bars 600, and the support bars 700 are formed on the metal plate 100. The inner lead 200X and the connecting part 500X differ from the inner lead 200 and the connecting part 500 in that the inner lead 200X and the connecting part 500X do not have the side surface 240 at a boundary therebetween.

Next, as illustrated in FIG. 13A and FIG. 15A, the photosensitive resists 810 and 820 are removed. Next, as in the first embodiment, the plating film 291 is formed on the metal plate 100, and the adhesive tape 292 is attached to the metal plate 100 (refer to FIG. 7B).

Next, as illustrated in FIG. 13B, the metal plate 100 is cut along the cutting line CL to remove the connecting part 500X and the tip portion of the inner lead 200X. This cutting may perform punching using a die, for example. In the reference example, because the side surface 240 is not formed, and the side surface 250 connects directly to the end surface 230, an area of the metal plate 100 sheared during the cutting is large, and a volume of the metal plate 100 processed during the cutting is large, when compared to the first embodiment. For this reason, burrs 50 are likely generated during the cutting. In particular, because burrs are generally more likely generated at sharp portions, as illustrated in FIG. 13B and FIG. 15B, the burr 50 is likely generated from a convex portion 253X of the side surface 250, and the burr 50 may connect to a convex portion 273X of the side surface 270 on the opposite side from the side surface 250. In this case, a short-circuit occurs via the burr 50.

Concave surfaces 251X and 252X and a pointed convex portion 253X of a side surface 250X of the inner lead 200X in the reference example illustrated in FIG. 14B through FIG. 15B are provided in place of the concave surfaces 241 and 242 and the pointed convex portion 243 of the side surface 240 of the inner lead 200 in the first embodiment, respectively. Similarly, concave surfaces 271X and 272X and a pointed convex portion 273X of a side surface 270X of the inner lead 200X in the reference example illustrated in FIG. 14B through FIG. 15B correspond to the concave surfaces 271 and 272 and the pointed convex portion 273 of the side surface 270 of the inner lead 200 in the first embodiment, respectively.

In contrast, in the present embodiment, the recess 814 is provided in the covering pattern 811, the area and the processing volume of the metal plate 100 sheared during the cutting can be reduced, and sharp portions can be reduced. For this reason, it is possible to prevent the generation of burrs during the cutting. Accordingly, it is possible to prevent the short-circuit between the inner leads and to improve the yield of the lead frame.

Second Embodiment

Next, a second embodiment will be described. The second embodiment relates to a semiconductor device manufactured using the lead frame 1.

[Structure of Semiconductor Device]

Figure 16:
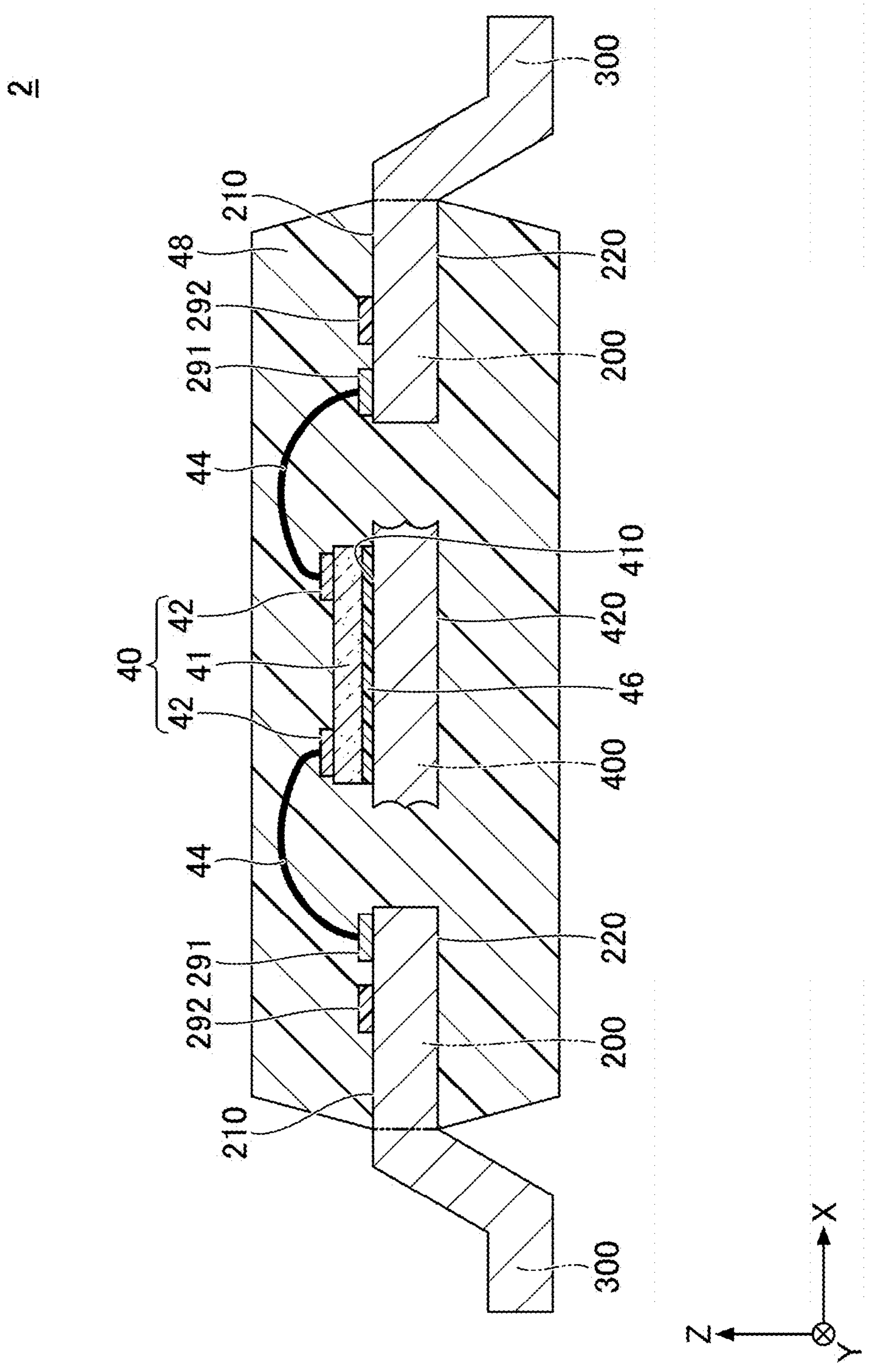
FIG. 16 is a cross sectional view illustrating a semiconductor device according to a second embodiment.

The structure of the semiconductor device according to the second embodiment will be described. FIG. 16 is a cross sectional view illustrating the semiconductor device according to the second embodiment.

A semiconductor device 2 according to the second embodiment includes a die pad 400, inner leads 200, outer leads 300, a semiconductor element 40, bonding wires 44, and an encapsulating resin 48. The dam bars 600 and the frame portion 20 are cut out from the lead frame 1.

The semiconductor element 40 includes a base 41 and a plurality of electrodes 42 provided on an upper surface of the base 41. The semiconductor element 40 is mounted on the die pad 400. A lower surface of the base 41 is bonded to the main surface 410 of the die pad 400 by an adhesive 46. A die attach film, a silver paste, a solder, or the like is used for the adhesive 46. The bonding wire 44 electrically connects the plating film 291 and the electrode 42. The encapsulating resin 48 encapsulates the semiconductor element 40, the bonding wires 44, the die pad 400, and the inner leads 200. The encapsulating resin 48 is a so-called mold resin or molded resin including a filler in an epoxy resin, for example. The outer leads 300 are located outside the encapsulating resin 48. The outer leads 300 are bent so as to be easily connectable to a mounting substrate, for example.

[Method for Manufacturing Semiconductor Device]

Figure 17A:
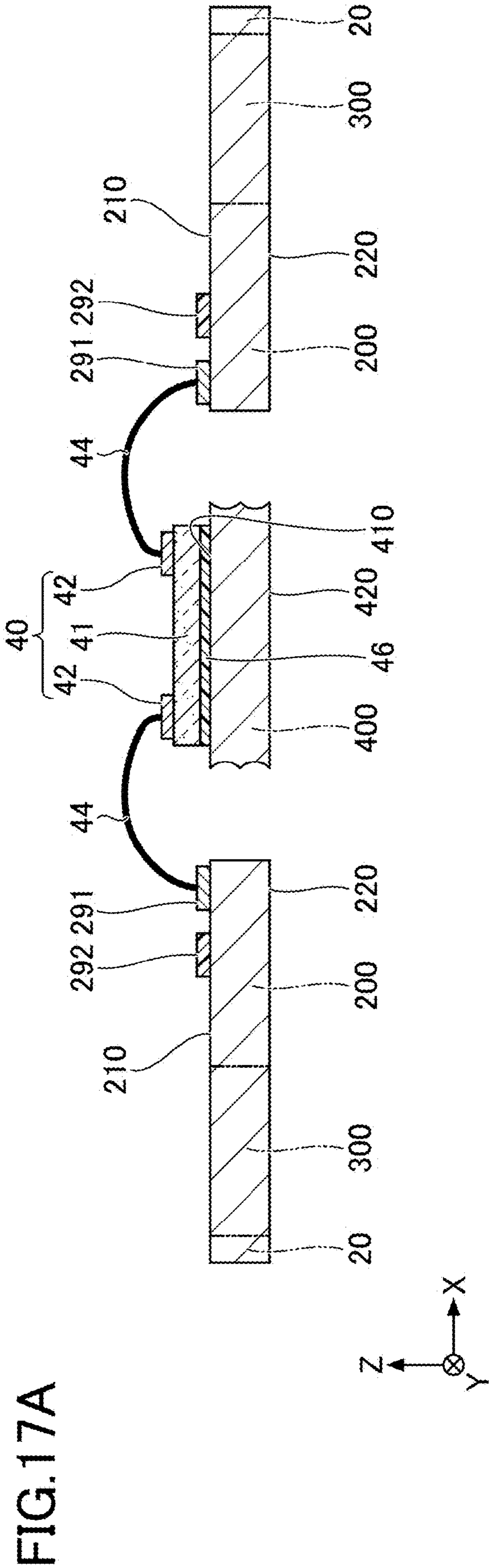
FIG. 17A and FIG. 17B are cross sectional views illustrating an example of a method for manufacturing the semiconductor device according to the second embodiment.
Figure 17B:
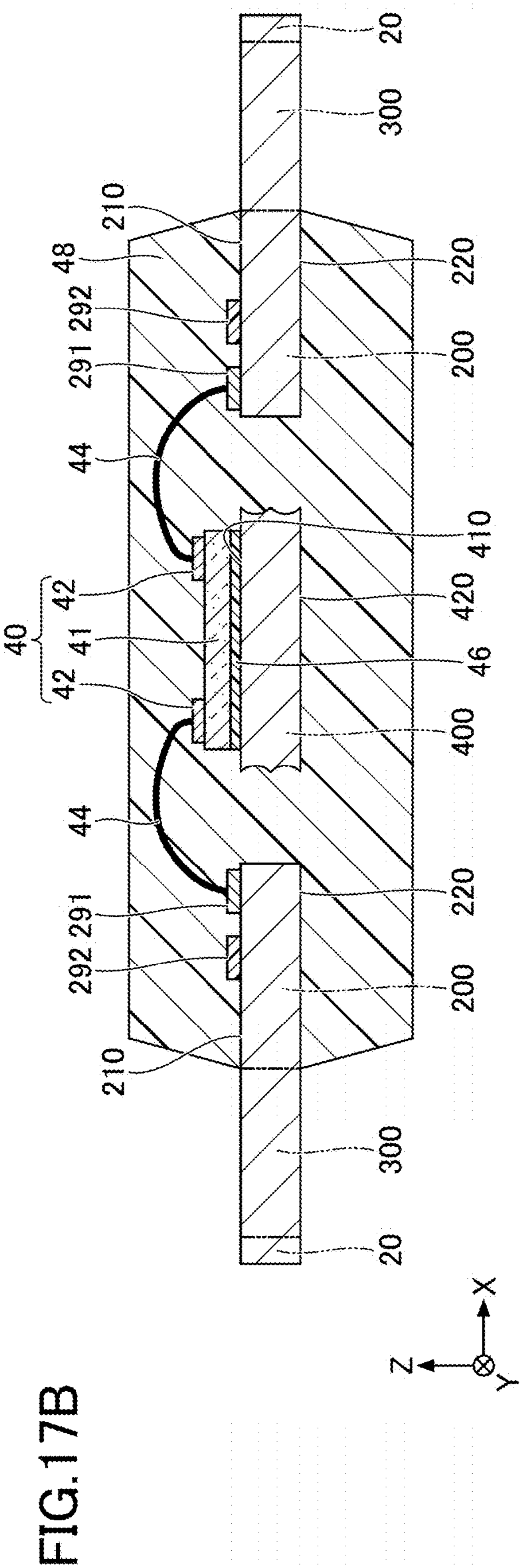

Next, a method for manufacturing the semiconductor device 2 according to the second embodiment will be described. FIG. 17A and FIG. 17B are cross sectional views illustrating an example of the method for manufacturing the semiconductor device according to the second embodiment.

First, as illustrated in FIG. 17A, the lead frame 1 is prepared, and the semiconductor element 40 is mounted on the die pad 400. In this state, the lower surface of the base 41 is bonded to the main surface 410 of the die pad 400 by the adhesive 46. Next, the plating film 291 and the electrode 42 are electrically connected using the bonding wire 44.

Next, as illustrated in FIG. 17B, the semiconductor element 40, the bonding wires 44, the die pad 400, and the inner leads 200 are encapsulated by the encapsulating resin 48. The encapsulating resin 48 can be formed by transfer molding, compression molding, or the like, for example.

Next, the dam bars 600 and the frame portion 20 are cut out from the lead frame 1, and the outer leads 300 are bent into a predetermined shape (refer to FIG. 16).

The semiconductor device 2 according to the second embodiment can be manufactured by the processes described above.

Because the semiconductor device 2 is manufactured using the lead frame 1, the short-circuit between the inner leads 200 can be prevented. The semiconductor device 2 may be manufactured using a lead frame 3, 4, or 5 which will be described later.

Instead of the connection using the bonding wires 44, the semiconductor element 40 may be mounted on the lead frame 1 by flip-chip bonding using solder bumps. In this case, the solder bumps are provided on the electrodes 42 of the semiconductor element 40, for example, and the solder bumps are connected to the plating film 291 of the lead frame 1. When the semiconductor element 40 is mounted on the lead frame 1 by the flip-chip bonding, the lead frame 1 does not require the die pad 400.

Third Embodiment

Figure 18A:
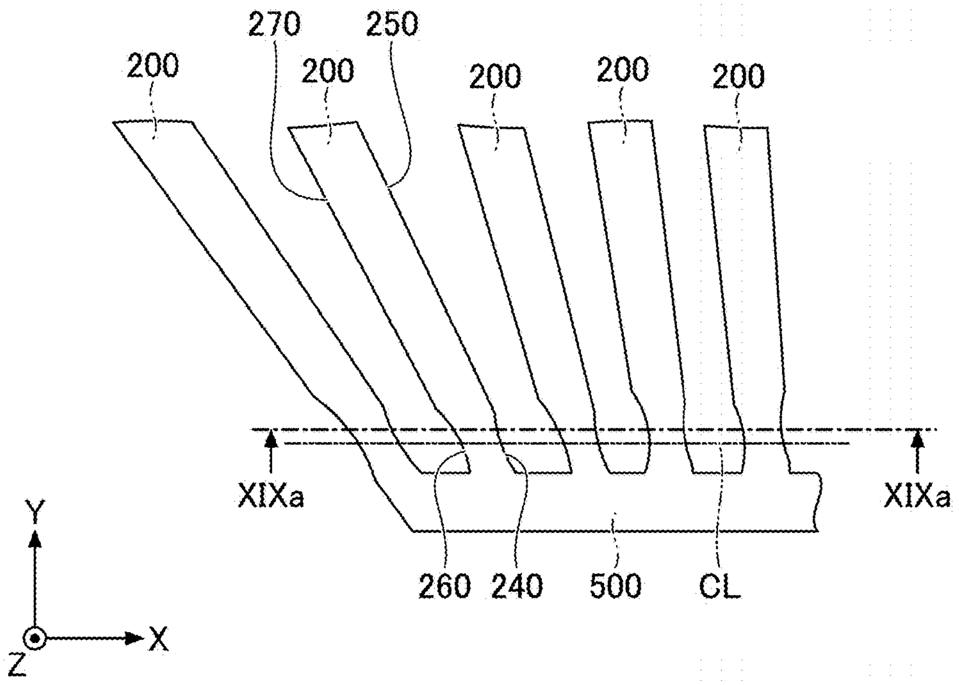
FIG. 18A and FIG. 18B are top views illustrating the example of the method for manufacturing the lead frame according to a third embodiment.
Figure 18B:
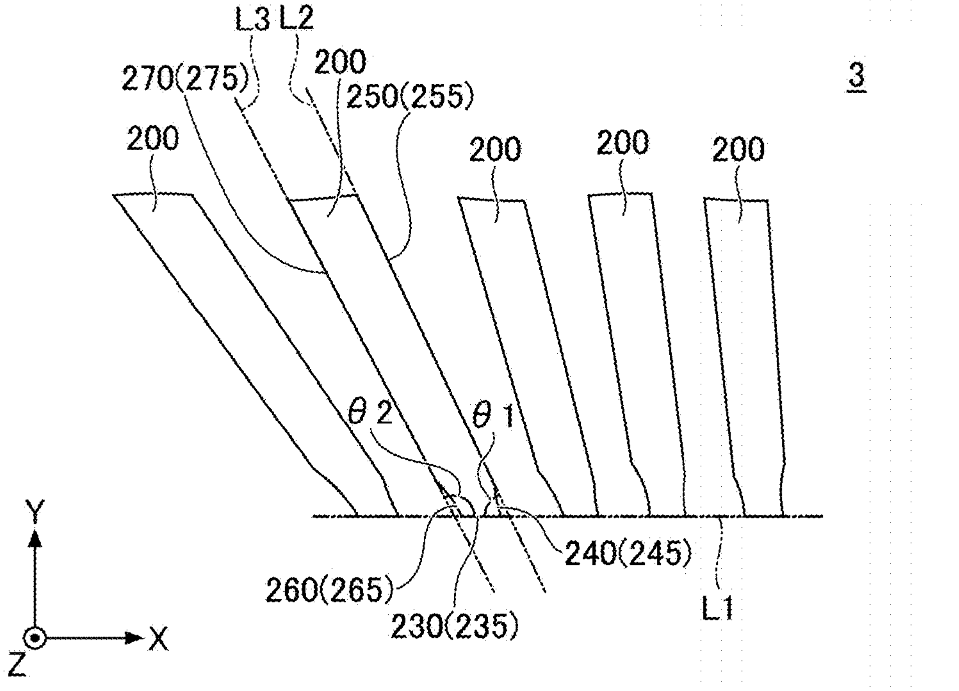
Figure 19A:
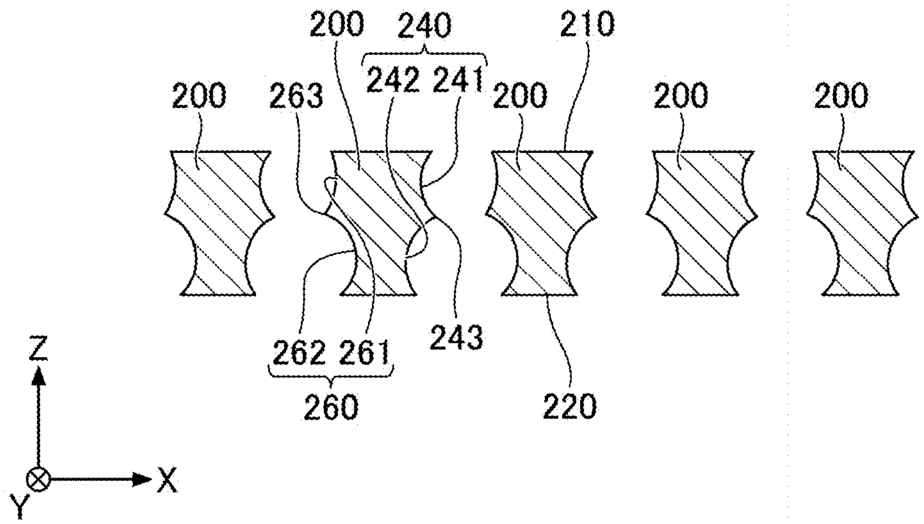
FIG. 19A and FIG. 19B are cross sectional views illustrating the example of the method for manufacturing the lead frame according to the third embodiment.
Figure 19B:
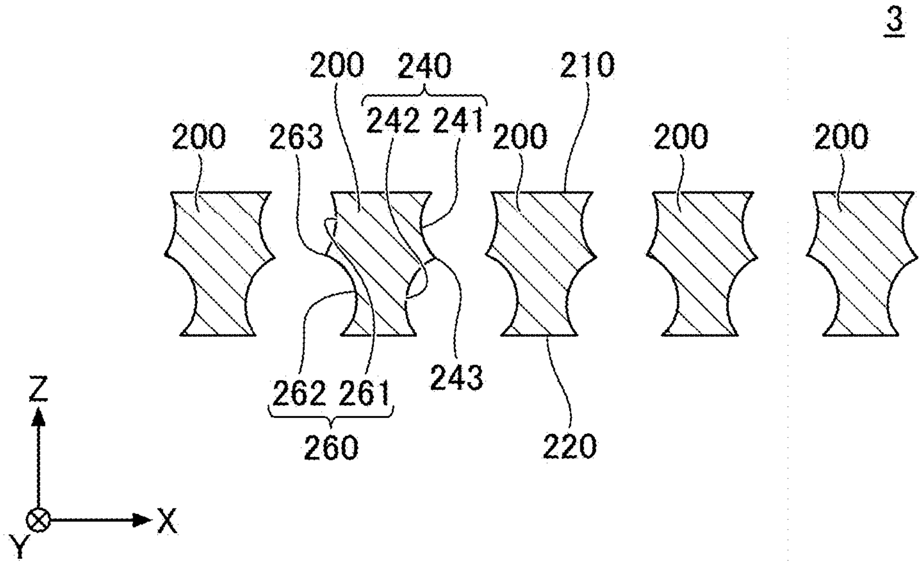

Next, a third embodiment will be described. The third embodiment differs from the first embodiment mainly in the shape of the end portion of the inner lead 200. Here, the structure of the lead frame according to the third embodiment will be described based on the method for manufacturing the lead frame. FIG. 18A and FIG. 18B are top views illustrating an example of the method for manufacturing the lead frame according to the third embodiment. FIG. 19A and FIG. 19B are cross sectional views illustrating the example of the method for manufacturing the lead frame according to the third embodiment. FIG. 19A and FIG. 19B illustrates a change in a cross section along a line XIXa-XIXa in FIG. 18A.

When manufacturing the lead frame 3, the covering pattern and the opening formed in the photosensitive resist 810 are modified from the covering pattern 811 and the opening 812. Specifically, the covering pattern of the photosensitive resist 810 and the shape of the opening are modified so that the inner leads 200 have the shape illustrated in FIG. 18B. As illustrated in FIG. 18B, in the lead frame 3, the line of intersection 245 is positioned on the side of the inner lead 200 of the imaginary straight line L1 and the imaginary straight line L2. In addition, the inner lead 200 has a side surface 260 connecting to the main surfaces 210 and 220, to the end surface 230, and to the side surface 270. The inner lead 200 is formed such that a line of intersection 265 between the main surface 210 and the side surface 260 is located on the side of the inner lead 200 than the imaginary straight line L1 and the imaginary straight line L3. For example, the line of intersection 265 is a curve that is concave toward the inside of the inner lead 200. For example, the side surface 260 is formed at a position closer to the die pad 400 than the portion of the main surface 210 formed with the plating film 291 (refer to FIG. 2). The side surface 260 may be formed from the end surface 230 to a proximal portion of the main surface 210 formed with the plating film 291. The side surface 260 may be formed from the end surface 230 to a portion of the main surface 210 on which the plating film 291 is formed. The side surface 260 is an example of a third side surface. The line of intersection 265 is an example of a fifth line of intersection.

As illustrated in FIG. 19B, the side surface 260 has a concave surface 261 formed on the +Z-side in the thickness direction of the metal plate 100, and a concave surface 262 formed on the −Z-side in the thickness direction of the metal plate 100. The concave surface 261 and the concave surface 262 are connected, and a pointed convex portion 263 is formed at a boundary between the concave surface 261 and the concave surface 262. The convex portion 263 is located at a position on the +Z-side than the center of the metal plate 100 in the thickness direction, for example. The concave portion formed in the photosensitive resist 810 to form the side surface 260 intersect the cutting line CL.

When the metal plate 100 is half-etched using the photosensitive resists 810 and 820 as etching masks, the frame portion 20, the inner leads 200, the outer leads 300, the die pad 400, the connecting part 500, the dam bars 600, and the support bars 700 are formed on the metal plate 100 as illustrated in FIG. 18A and FIG. 19A. In this state, the side surfaces 240 and 260 are formed to intersect the cutting line CL. Next, the photosensitive resists 810 and 820 are removed. FIG. 18A and FIG. 19A illustrate a state after the photosensitive resists 810 and 820 are removed.

Next, similar to the first embodiment, the plating film 291 is formed on the main surface 210 of the inner lead 200, and the adhesive tape 292 is attached to the main surface 210 of the inner lead 200 (refer to FIG. 7B). Next, as illustrated in FIG. 18B, the metal plate 100 is cut along the cutting line CL to remove the connecting part 500 and the tip portions of the inner leads 200. In this state, as illustrated in FIG. 18B and FIG. 19B, no burr is formed on the cutting surface and in the vicinity thereof. In FIG. 18A and FIG. 18B, the illustration of the plating film 291 and the adhesive tape 292 is omitted for the sake of convenience.

The lead frame 3 according to the third embodiment can be manufactured by the processes described above.

The third embodiment can also obtain the same effects as those obtainable in the first embodiment. In the third embodiment, the side surface 260 is provided between the end surface 230 and the side surface 270, the area and the processing volume of the metal plate 100 sheared during the cutting can further be reduced, and sharp portions can further be reduced. For this reason, it is even easier to further prevent the generation of burrs during the cutting.

Fourth Embodiment

Figure 20A:
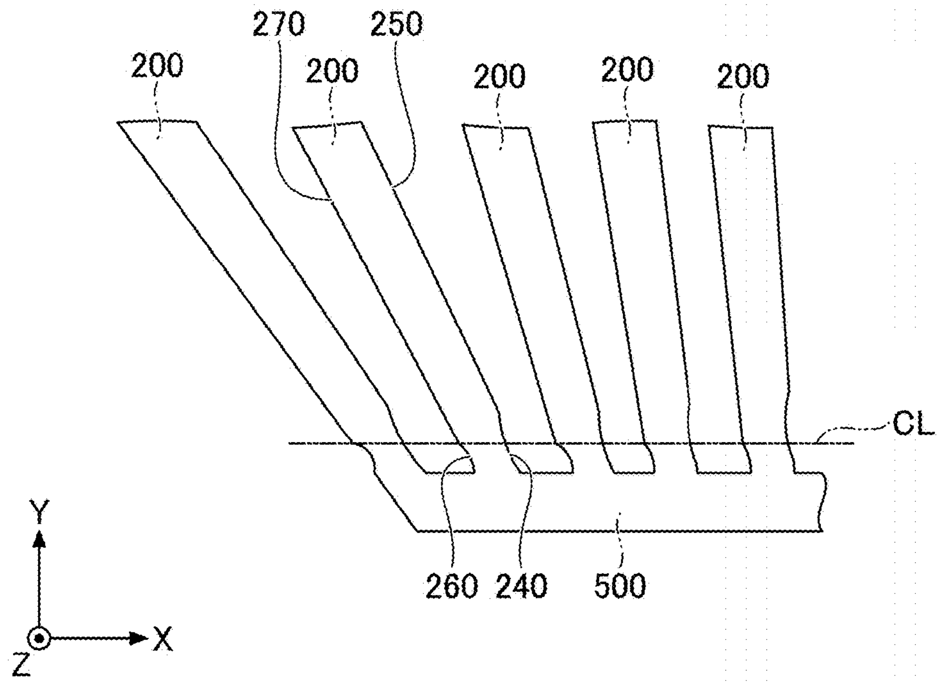
FIG. 20A and FIG. 20B are top views illustrating an example of the method for manufacturing the lead frame according to a fourth embodiment.
Figure 20B:
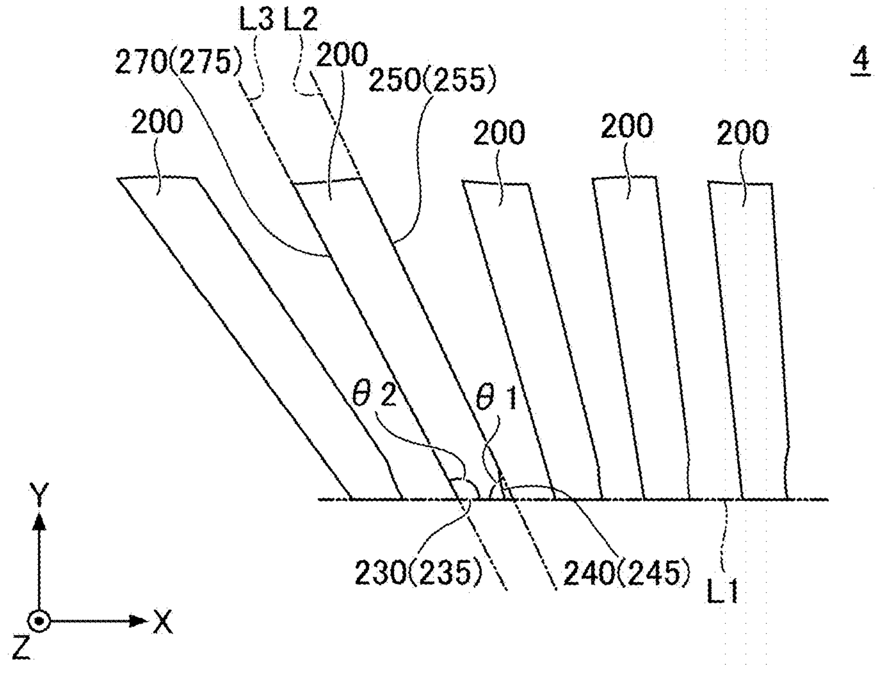

Next, a fourth embodiment will be described. The fourth embodiment differs from the third embodiment mainly in a range of the side surface 260 during the manufacturing method. FIG. 20A and FIG. 20B are top views illustrating an example of the method for manufacturing the lead frame according to the fourth embodiment.

As described above, in the third embodiment, the concave portion formed in the photosensitive resist 810 to form the side surface 240 and the concave portion formed in the photosensitive resist 810 to form the side surface 260 intersect the cutting line CL. In contrast, in the fourth embodiment, the concave portion formed in the photosensitive resist 810 to form the side surface 260 is located closer to the die pad 400 than the cutting line CL. For this reason, as illustrated in FIG. 20A, the side surface 240 is formed so as to intersect the cutting line CL, but the side surface 260 is formed on the side of the die pad 400 with respect to the cutting line CL.

Further, similar to the first embodiment, the plating film 291 is formed on the main surface 210 of the inner lead 200, and the adhesive tape 292 is attached to the main surface 210 of the inner lead 200 (refer to FIG. 7B). Then, as illustrated in FIG. 20B, the metal plate 100 is cut along the cutting line CL to remove the connecting parts 500 and the tip portions of the inner leads 200. In FIG. 20A and FIG. 20B, illustration of the plating film 291 and the adhesive tape 292 is omitted for the sake of convenience.

The lead frame 4 according to the fourth embodiment can be manufactured by the processes described above.

The fourth embodiment can also obtain the same effects as those obtainable in the first embodiment.

Fifth Embodiment

Figure 21A:
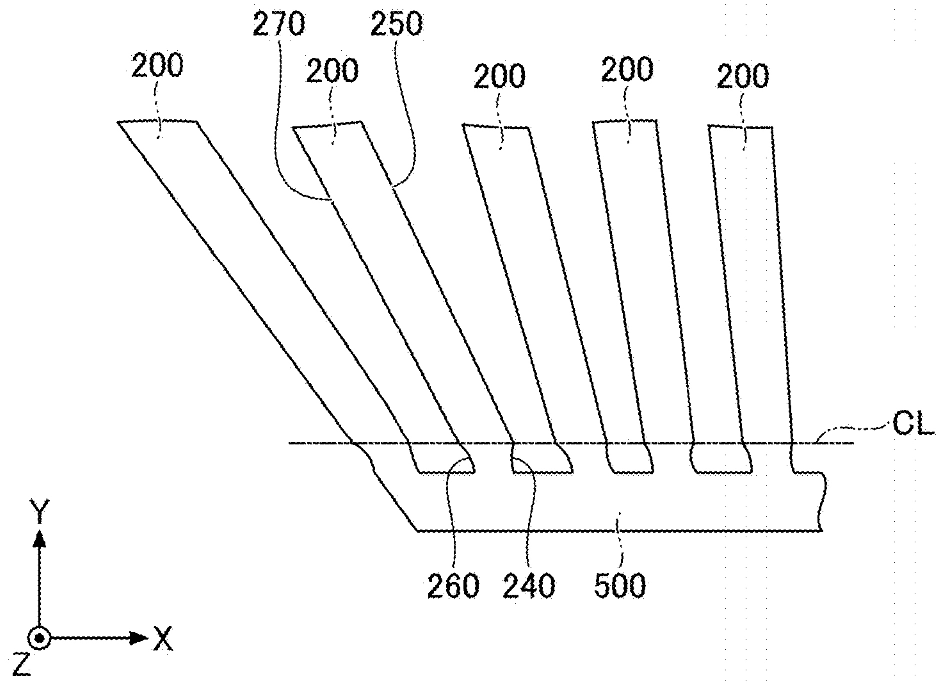
FIG. 21A and FIG. 21B are top views illustrating an example of the method for manufacturing the lead frame according to a fifth embodiment.
Figure 21B:
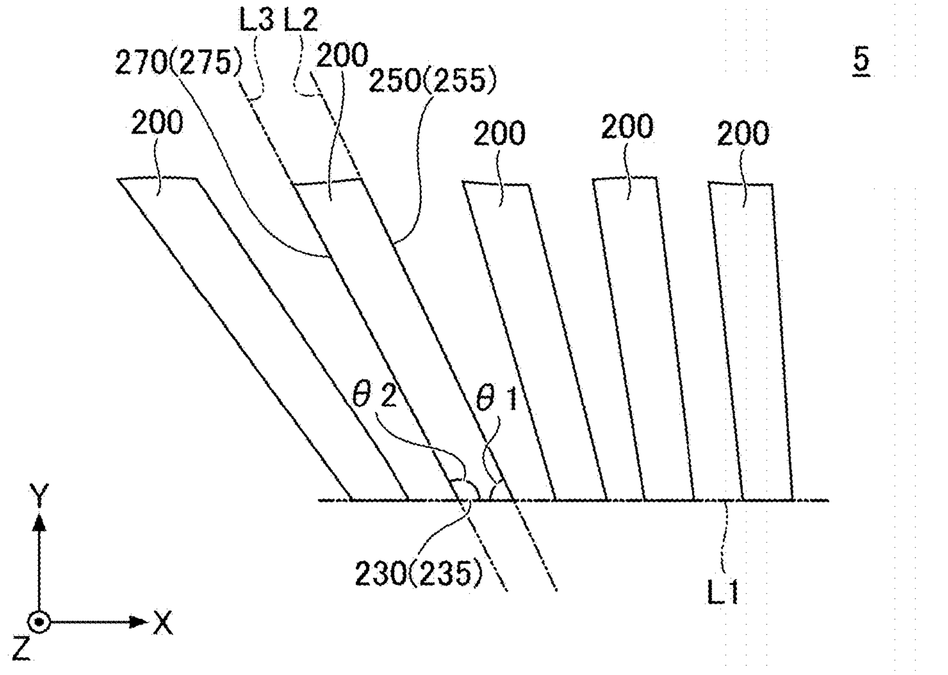

Next, a fifth embodiment will be described. The fifth embodiment differs from the fourth embodiment mainly in the range of the side surface 240 during the manufacturing method. FIG. 21A and FIG. 21B are top views illustrating an example of the method for manufacturing the lead frame according to the fifth embodiment.

As described above, in the fourth embodiment, the concave portion formed in the photosensitive resist 810 for forming the side surface 240 intersects the cutting line CL, and the concave portion formed in the photosensitive resist 810 for forming the side surface 260 is closer to the die pad 400 than the cutting line CL. In contrast, in the fifth embodiment, not only the recess formed in the photosensitive resist 810 for forming the side surface 260 but also the recess formed in the photosensitive resist 810 for forming the side surface 240 is located closer to the die pad 400 than the cutting line CL. For this reason, as illustrated in FIG. 21A, the side surfaces 240 and 260 are formed closer to the die pad 400 than the cutting line CL.

Further, similar to the first embodiment, the plating film 291 is formed on the main surface 210 of the inner lead 200, and the adhesive tape 292 is attached to the main surface 210 of the inner lead 200 (refer to FIG. 7B). Then, as illustrated in FIG. 21B, the metal plate 100 is cut along the cutting lines CL to remove the connecting parts 500 and the tip portions of the inner leads 200. In FIG. 21A and FIG. 21B, the illustration of the plating film 291 and the adhesive tape 292 is omitted for the sake of convenience.

The lead frame 5 according to the fifth embodiment can be manufactured by the processes described above.

In the fifth embodiment, the amount of processing of the metal plate 100 during the cutting is reduced and the number of sharp portions is reduced when compared to the reference example, and thus, the generation of burrs during the cutting can easily be prevented. That is, by forming the side surfaces 240 and 260, the etchant is likely to spread to the portions where the side surfaces 250 and 270 are formed during the wet etching of the metal plate 100, and a size of the convex portions formed on the side surfaces 250 and 270 can be reduced. For this reason, a size of the sharp portions can be made small, and the generation of burrs during the cutting can be prevented. This effect is also obtainable in the first through fourth embodiments.

According to the disclosed technique, it is possible to prevent deterioration of the yield.

Various aspects of the subject-matter described herein may be set out non-exhaustively in the following numbered clauses:

1. A method for manufacturing a lead frame, comprising:
forming a plurality of inner leads arranged in a first direction and a connecting part connecting end portions of the plurality of inner leads by performing a wet etching on a metal plate having a first main surface;
removing the connecting part by cutting the metal plate along a cutting line, wherein
the wet etching includes forming on each inner lead of the plurality of inner leads
a first side surface connecting to the first main surface and intersecting the cutting line, and
a second side surface connecting to the first main surface and to the first side surface, and
in a plan view perpendicular to the first main surface,
an angle between a first imaginary straight line including the cutting line and a second imaginary straight line including a second line of intersection between the first main surface and the second side surface is less than 90 degrees on a side of each inner lead, and
a third line of intersection between the first main surface and the first side surface is located on the side of each inner lead than the first imaginary straight line and the second imaginary straight line.

2. The method for manufacturing the lead frame according to clause 1, wherein the wet etching includes forming on each inner lead
a third side surface connected to the first main surface and intersecting the cutting line on a side opposite to the first side surface, and
a fourth side surface connecting to the first main surface and to the third side surface, and
in a plan view perpendicular to the first main surface,
an angle between the first imaginary straight line and a third imaginary straight line including a fourth line of intersection between the first main surface and the fourth side surface is 90 degrees or greater on the side of each inner lead, and
a fifth line of intersection between the first main surface and the third side surface is located on the side of each inner lead than the first imaginary straight line and the third imaginary straight line.

Although the embodiments are numbered with, for example, "first", "second", . . . , "fifth", the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
a plurality of inner leads arranged in a first direction, wherein
each inner lead of the plurality of inner leads includes:
a first main surface parallel to the first direction;
an end surface connecting to the first main surface;
a first side surface connecting to the first main surface and to the end surface; and
a second side surface connected to the first main surface and to the first side surface,
in a plan view perpendicular to the first main surface,
an angle between a first imaginary straight line including a first line of intersection between the first main surface and the end surface, and a second imaginary straight line including a second line of intersection between the first main surface and the second side surface, is less than 90 degrees on a side of each inner lead, and
a third line of intersection between the first main surface and the first side surface is located on the side of each inner lead than the first imaginary straight line and the second imaginary straight line.

2. The lead frame as claimed in claim 1, wherein:
each inner lead has a second main surface opposite to the first main surface, and
a width of the inner lead is wider at the first main surface than at the second main surface in a range including the second side surface in a longitudinal direction of each inner lead.

3. The lead frame as claimed in claim 1, wherein the third line of intersection is a curve that is concave toward an inside of each inner lead.

4. The lead frame as claimed in claim 1, wherein the inner lead includes:
a third side surface connecting to the first main surface and connecting to the end surface on a side opposite to the first side surface, and
a fourth side surface connecting to the first main surface and to the third side surface,
in the plan view perpendicular to the first main surface, an angle between the first imaginary straight line and a third imaginary straight line including a fourth line of intersection between the first main surface and the fourth side surface is 90 degrees or greater on the side of each inner lead, and
a fifth line of intersection between the first main surface and the third side surface is located on the side of each inner lead than the first imaginary straight line and the third imaginary straight line.

5. The lead frame as claimed in claim 4, wherein the fifth line of intersection is a curve that is concave toward an inside of each inner lead.

6. The lead frame as claimed in claim 1, further comprising:

a plating film provided on the first main surface.

7. The lead frame as claimed in claim 1, wherein end surfaces the plurality of inner leads are located on a common plane.

8. A semiconductor device comprising:

a die pad;

a semiconductor element provided on the die pad;

a plurality of inner leads provided around the die pad and arranged in a first direction;

a wire connecting the semiconductor element and each inner lead of the plurality of inner leads, wherein each inner lead includes:

a first main surface parallel to the first direction;

an end surface connecting to the first main surface;

a first side surface connecting to the first main surface and to the end surface; and a second side surface connected to the first main surface and to the first side surface, in a plan view perpendicular to the first main surface, an angle between a first imaginary straight line including a first line of intersection between the first main surface and the end surface, and a second imaginary straight line including a second line of intersection between the first main surface and the second side surface, is less than 90 degrees on a side of each inner lead, and a third line of intersection between the first main surface and the first side surface is located on the side of each inner lead than the first imaginary straight line and the second imaginary straight line.

* * * * *